United States Patent [19]
Saeki

[11] Patent Number: 6,052,004
[45] Date of Patent: Apr. 18, 2000

[54] METHOD AND APPARATUS FOR CONTROLLING CLOCK SIGNALS

[75] Inventor: Takanori Saeki, Tokyo, Japan

[73] Assignee: NEC Corporation, Tokyo, Japan

[21] Appl. No.: 09/097,049

[22] Filed: Jun. 15, 1998

[30] Foreign Application Priority Data

Jun. 13, 1997 [JP] Japan .................................. 9-157028

[51] Int. Cl.⁷ .................................................. H03B 19/00
[52] U.S. Cl. .......................................... 327/116; 327/119
[58] Field of Search ................................... 327/113, 116, 327/119, 120, 121, 122, 356, 153, 161; 377/47, 48

[56] References Cited

U.S. PATENT DOCUMENTS 3,826,901  7/1974  Band et al. ............................ 708/103
5,254,955  10/1993 Saeki ........................................ 331/34
5,548,249  8/1996  Sumita et al. ......................... 331/1 A

*Primary Examiner*—Tuan T. Lam
*Attorney, Agent, or Firm*—Young & Thompson

[57] ABSTRACT

A clock signal control circuit includes a divider for dividing an external clock signal into multiple phase clock signals, timing difference dividers connected to the divider for dividing a difference in input timing of pulse edge between the multiple phase clock signals having different phases from each other to generate different phase clock signals, multiplexers connected to the timing difference dividers for multiplexing the different phase multiplied clock signals to generate multiplexed clock signals, and a synthesizer connected to the multiplexers for synthesizing the multiplexed clock signals into a single multiplied clock signal.

31 Claims, 14 Drawing Sheets

METHOD AND APPARATUS FOR CONTROLLING CLOCK SIGNALS

BACKGROUND OF THE INVENTION

The present invention relates in general to a method and an apparatus for controlling clock signals.

Conventional clock signal multiplier circuits are disclosed, for example, in ISSCC Digest of Technical Papers pp. 216–217, February 1996, and U.S. Pat. No. 5,422,835 and U.S. Pat. No. 5,530,837. A typical one of the conventional clock signal multiplier circuits is will be described with reference to FIG. 1. If four times multiplication of the clock signal required, a set of four delay circuits 301, 302, 303 and 304 are provided which are respectively connected to four switch circuits 305, 306, 307 and 308 so that each of the switch circuits 305, 306, 307 and 308 selects one of the output terminals of the corresponding one of the delay circuits 301, 302, 303 and 304. The four switch circuits 305, 306, 307 and 308 are respectively connected through the four switch circuits 305, 306, 307 and 308 to a single counter 310. The four sets of the delay circuit and the switch circuit are connected in series to each other. A first clock signal 311 as an external clock signal is inputted into the first delay circuit 301. A second clock signal 312 is outputted from the first switch circuit 305 and inputted into the second delay circuit 302. A third clock signal 313 is outputted from the second switch circuit 306 and inputted into the third delay circuit 303. A fourth clock signal 314 is outputted from the third switch circuit 307 and inputted into the fourth delay circuit 304. A fifth clock signal 315 is outputted from the fourth switch circuit 308 and inputted into a phase comparator 309. The first clock signal is also inputted into the phase comparator 309. The phase comparator 309 receives the first and fifth clock signals 311 and 315 for phase comparison between the first and fifth clock signals 311 and 315. The phase comparator 309 outputs an UP-signal 316 or a DOWN-signal 317 on the basis of the result of the phase comparison between the first and fifth clock signals 311 and 315 and the UP-signal 316 or the DOWN-signal 317 is transmitted to the counter 310. The counter 310 outputs a control signal 318 on the basis of the UP-signal 316 or the DOWN-signal 317. The control signal 318 is transmitted to the four switch circuits 305, 306, 307 and 308 respectively. The control signal is such as to adjust the first and fifth clock signals 311 and 315 to be identical in phase to each other. Delay times of the four delay circuits 301, 302, 303 and 304 are adjusted to be equal to each other, for which reason individual differences in timing are made equal to each other between the first and second clock signals 311 and 312, between the second and third clock signals 312 and 313, and between the third and fourth clock signals 313 and 314. The difference in timing between adjacent two of the four sets of the delay circuit and the switch circuit corresponds to one quarter of a time period of the clock signal. The first clock signal 311, the second clock signal 312, the first clock signal 131 and the fourth clock signal are synthesized in order to obtain a four-time multiplied clock signal.

The clock signal multiplier circuit may comprise a phase lock loop circuit as illustrated in FIG. 2. The clock signal multiplier circuit has a voltage control signal generator 322 and a divider 323 connected to the voltage control signal generator 322 for receiving output signals from the voltage control signal generator 322 to divide the signal. The clock signal multiplier circuit further has a phase comparator 319 connected to the divider 323 for receiving the divided signal from the divider 323 and also receiving an external clock signal 324 in order to conduct a comparison in phase between the divided signal and the external clock signal 324. The phase comparator 319 outputs an UP-signal 325 or a DOWN-signal 326 on the basis of the result of the phase comparison. The clock signal multiplier circuit further has a charge pump circuit 320 connected to the phase comparator 319 for receiving the UP-signal 325 or the DOWN-signal 326 from the phase comparator 319, and a loop filter circuit 321 connected to the charge pump circuit 320 for receiving an output signal from the charge pump circuit 320. The above voltage control signal generator 322 is also connected to the loop filter circuit 321 for receiving an output signal from the loop filter circuit 321 whereby the voltage control signal generator 322 controls a voltage of the signal to be transmitted to the divider 323 on the basis of the received signal from the loop filter circuit 321 so that the divided clock signal is equal in frequency to the external clock signal 324. For this purpose, the voltage control signal generator 322 generates a multiplied clock signal 327 which has an inverse multiple to the dividing number.

The first conventional clock signal multiplier circuit as illustrated in FIG. 1 has a disadvantage that it is necessary to make the phase comparison more than several tens of times between the external clock signal and the delayed clock signals supplied through the series connections of the four sets of the delay circuit and the switch circuit, wherein differences in delay and phase are gradually compensated in each comparison process and after the several tens of phase comparison processes have been executed, then it is possible to obtain the multiplied clock signal. This means it difficult for the first conventional clock signal multiplier circuit to exhibit high speed performance.

The second conventional clock signal multiplier circuit as illustrated in FIG. 2 also has a disadvantage that it is necessary to make the phase comparison more than several tens of times between the external clock signal 324 and the divided clock signals supplied through the divider, wherein differences in delay and phase are gradually compensated in each comparison process and after the several tens of phase comparison processes have been executed, then it is possible to obtain the multiplied clock signal. This means it difficult for the second conventional clock signal multiplier circuit to exhibit high speed performances.

For the above first and second conventional clock signal multiplier circuits, it takes a time corresponding to several tens of clock signals to obtain the required multiplied clock signals.

Further, the above first and second conventional clock signal multiplier circuits are available to control the clock signals but inapplicable as a delay circuit varying signal delay time.

In the above circumstances, it had been required to develop a novel clock signal multiplier circuit free from the above problems.

SUMMARY OF THE INVENTION

Accordingly, it is an object of the present invention to provide a novel clock signal control circuit free from the above disadvantages.

It is a further object of the present invention to provide a novel clock signal control circuit which exhibits high speed performance.

It is a still further object of the present invention to provide a novel clock signal control circuit capable of obtaining multiplied clock signals in a short time.

It is yet a further object of the present invention to provide a novel clock signal control circuit which is available not only as a clock signal multiplier circuit but also as a variable delay circuit capable of varying delay time of the clock signal.

It is a further object of the present invention to provide a novel clock signal control method from the above disadvantages.

It is still another object of the present invention to provide a novel clock signal control method which allows a clock signal control circuit to exhibit high speed performance.

It is moreover an object of the present invention to provide a novel clock signal control method of obtaining multiplied clock signals in a short time.

It is another object of the present invention to provide a novel clock signal control method which allows a clock signal control circuit to be available not only as a clock signal multiplier circuit but also as a variable delay circuit capable of varying delay time of the clock signal.

The present invention provides clock signal control circuitry comprising the following elements. A divider is provided for dividing an external clock signal into multiple phase clock signals. Timing difference dividers are provided which are connected to the divider for dividing a difference in input timing of pulse edges between the multiple phase clock signals having different phases from each other to generate different phase clock signals. Multiplexers are provided which are connected to the timing difference dividers for multiplexing the different phase multiplied clock signals to generate multiplexed clock signals. A synthesizer is provided which is connected to the multiplexers for synthesizing the multiplexed clock signals into a single multiplied clock signal.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
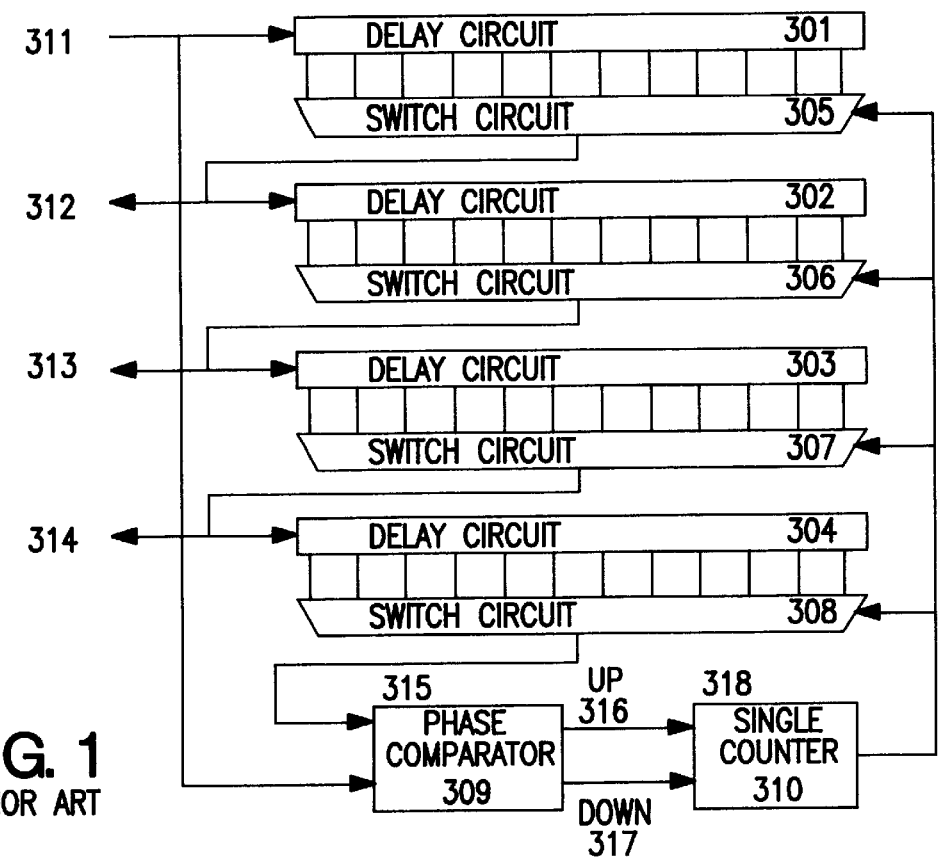
FIG. 1 is a schematic block diagram illustrative of the typical one of the conventional clock signal multiplier circuits.
Figure 2:
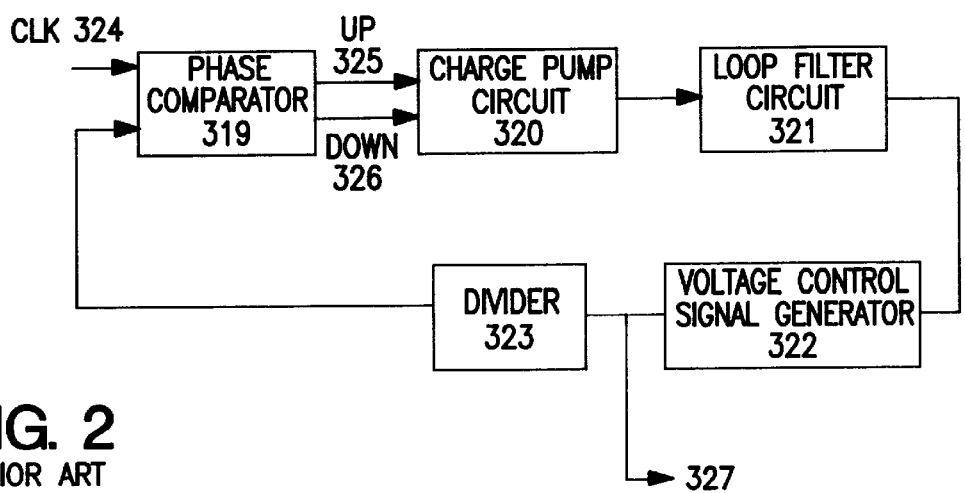
FIG. 2 is a schematic block diagram illustrative of the conventional phase lock loop circuit used in the conventional clock signal multiplier circuit.

The first present invention provides a clock signal control circuit comprising the following elements. A divider is provided for dividing an external clock signal into multiple phase clock signals. timing difference dividers are provided which are connected to the divider for dividing a difference in input timing of pulse edge between the multiple phase clock signals having different phases from each other to generate different phase clock signals. Multiplexers are provided which are connected to the timing difference dividers for multiplexing the different phase multiplied clock signals to generate multiplexed clock signals. A synthesizer is provided which is connected to the multiplexers for synthesizing the multiplexed clock signals into a single multiplied clock signal.

It is preferable that the divider comprises a ½ divider for dividing the external clock signal into two-phase clock signals and also that the timing difference divider comprises four timing difference dividers connected in parallel to each other and the multiplexer comprises two multiplexers connected in parallel to each other.

It is also preferable that the divider comprises a ¼ divider for dividing the external clock signal into four-phase clock signals and that the timing difference divider comprises eight timing difference dividers connected in parallel to each other and the multiplexer comprises four multiplexers connected in parallel to each other. It is further preferable to further provide eight pulse width compensation circuits which connected between the eight timing difference dividers and the four multiplexers.

It is also preferable that the timing difference divider is connected to a period detection circuit for receiving a control signal from the period detection circuit.

It is also preferable that the timing difference dividers and the multiplexers are provided to form a plurality of multiple phase clock signal multiplier circuits connected in series between the divider and the synthesizer.

It is also preferable that the timing difference dividers include MOS field effect transistors and capacitors and the timing difference dividers are different from each other in gate width of the MOS field effect transistors and in capacitance of the capacitors.

The second aspect of the present invention provides a multiple phase clock signal multiplier comprising a plurality of timing difference dividers for dividing a difference in input timing of pulse edge between received multiple phase clock signals having different phases each other to generate different phase clock signals; and a plurality of multiplexers connected to the timing difference dividers for multiplexing the different phase multiplied clock signals to generate multiplexed clock signals.

It is preferable that the timing difference divider comprises four timing difference dividers connected in parallel to each other and the multiplexer comprises two multiplexers connected in parallel to each other.

It is also preferable that the timing difference divider comprises eight timing difference dividers connected in parallel to each other and the multiplexer comprises four multiplexers connected in parallel to each other. It is further preferable to further provide eight pulse width compensation circuits which connected between the eight timing difference dividers and the four multiplexers.

It is preferable that the timing difference divider is connected to a period detection circuit for receiving a control signal from the period detection circuit.

It is also preferable that the timing difference dividers and the multiplexers are provided to form a plurality of multiple phase clock signal multiplier circuits connected in series.

It is also preferable that the timing difference dividers include MOS field effect transistors and capacitors and the timing difference dividers are different from each other in gate width of the MOS field effect transistors and in capacitance of the capacitors.

The third aspect of the present invention provides a clock signal control circuitry comprising the following elements. A divider is provided for dividing an external clock signal into multiple phase clock signals. A plurality of multiple phase clock signal multiplier circuits are provided which are connected in series to each other and also connected to the divider for receiving the multiple phase clock signals. A synthesizer is provided which is connected to the multiplexers for synthesizing the multiplexed clock signals into a single multiplied clock signal. Each of the multiple phase clock signal multiplier circuits comprises a plurality of timing difference dividers connected in parallel to each other and also connected to the divider for dividing a difference in input timing of pulse edge between the multiple phase clock signals having different phases from each other to generate different phase clock signals and multiplexers connected in parallel to each other and also connected to the timing difference dividers for multiplexing the different phase multiplied clock signals to generate multiplexed clock signals.

It is preferable that the divider comprises a ½ divider for dividing the external clock signal into two-phase clock signals and that each of the multiple phase clock signal multiplier circuits has four timing difference dividers connected in parallel to each other and the multiplexer comprises two multiplexers connected in parallel to each other.

It is also preferable that the divider comprises a ¼ divider for dividing the external clock signal into four-phase clock signals and that each of the multiple phase clock signal multiplier circuits has eight timing difference dividers connected in parallel to each other and the multiplexer comprises four multiplexers connected in parallel to each other. It is further preferable that in each of the multiple phase clock signal multiplier circuits further has eight pulse width compensation circuits which connected between the eight timing difference dividers and the four multiplexers.

It is also preferable that the timing difference dividers are connected to a period detection circuit for receiving a control signal from the period detection circuit.

It is also preferable that the timing difference dividers in each of the multiple phase clock signal multiplier circuits include MOS field effect transistors and capacitors and the timing difference dividers are different from each other in gate width of the MOS field effect transistors and in capacitance of the capacitors.

The fourth aspect of the present invention provides a multiple phase clock signal multiplier comprising the following elements. A series connection of a plurality of multiple phase clock signal multiplier circuits is provided. Each of the multiple phase clock signal multiplier circuits comprises a plurality of timing difference dividers for dividing a difference in input timing of pulse edge between received multiple phase clock signals having different phases from each other to generate different phase clock signals and a plurality of multiplexers connected to the timing difference dividers for multiplexing the different phase multiplied clock signals to generate multiplexed clock signals.

It is preferable that each of the multiple phase clock signal multiplier circuits has four timing difference dividers connected in parallel to each other and the multiplexer comprises two multiplexers connected in parallel to each other.

It is also preferable that each of the multiple phase clock signal multiplier circuits has eight timing difference dividers connected in parallel to each other and the multiplexer comprises four multiplexers connected in parallel to each other. It is further preferable that each of the multiple phase clock signal multiplier circuits has eight pulse width compensation circuits which connected between the eight timing difference dividers and the four multiplexers.

It is also preferable that the timing difference divider is connected to a period detection circuit for receiving a control signal from the period detection circuit.

It is also preferable that the timing difference dividers of each of the multiple phase clock signal multiplier circuits include MOS field effect transistors and capacitors and the timing difference dividers are different from each other in gate width of the MOS field effect transistors and in capacitance of the capacitors.

PREFERRED EMBODIMENTS

First Embodiment

Figure 3:
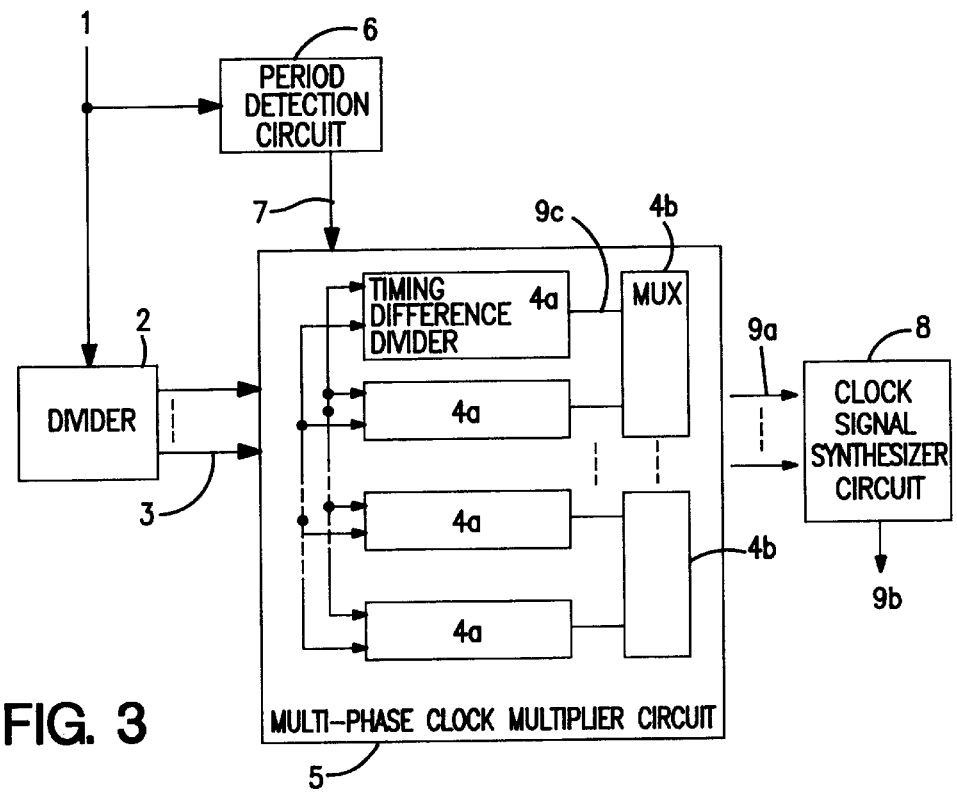
FIG. 3 is a novel clock signal multiplier circuit in accordance with the present invention.

A first embodiment according to the present invention will be described in detail with reference to the drawings. This embodiment provides a novel clock signal multiplier circuit for multiplying external clock signals as illustrated in FIG. 3, wherein an external lock signal 1 is first divided into multi-phase clock signals 3 by a divider 2 so that a multi-phase clock signal multiplier circuit 5 divides differences in input timing of pulse edges of phase-differentiated multi-phase clock signals 3 from the divider 2 for subsequent multiplication of the divided different phase clock signals 9c before those multiplexed phase clock signals 9a are then synthesized by a clock signal synthesizer circuit 8 to obtain a multiplied clock signal 9b.

Namely, the novel clock signal multiplier circuit comprises the divider 2, the multi-phase clock signal multiplier circuit 5 and the clock signal synthesizer circuit 8. The divider 2 is provided to divide the external clock signal 1 into the multi-phase clock signals 3. The multi-phase clock signal multiplier circuit 5 further has a plurality of timing difference dividers 4a, each of which is operated to divide different phase pulses of the different phase clock signals during the multi-phase clock signals 3, a plurality of other timing difference dividers 4a, each of which is operated to divide the same phase pulses of the same phase clock signals during the multi-phase clock signals 3, and a plurality of multiplexer circuits 4b for multiplexing the divided different phase pulses 9c to generate multi-phase clock signals 9a. The clock signal synthesizer circuit 8 is provided to synthesize the multi-phase clock signals 9a. The above plural timing difference dividers 4a are connected in parallel to each other between the divider 2 and the multiplexer circuits 4b.

With reference again to FIG. 3, the external lock signal 1 is first divided into the multi-phase clock signals 3 by the divider 2 so that the timing difference dividers 4a divide differences in input timing of pulse edges of phase-differentiated multi-phase clock signals 3 from the divider 2 for subsequent multiplexing of the divided different phase clock signals 9c by the multiplexer circuit 4b before those multiplexed phase clock signals 9a are then synthesized by the clock signal synthesizer circuit 8 to obtain the required multiplied clock signal 9b.

The novel clock signal multiplier circuit of the first embodiment in accordance with the present invention will further be described in more detail with reference again to FIG. 4, wherein an external clock signal is divided into two different phase clock signals for subsequent synthesizing the two different phase clock signals to obtain a multiplied clock signal. A divider 2 is operated to divide the external clock signal 1 into two different phase clock signals D1 and D2. Two-phase clock signal multiplier circuits $5_1, 5_2$ - - - $5_n$ are connected in series to each other between the divider 2 and the clock signal synthesizer circuit 8 for dividing differences in input timing of the pulse edges with different phases of the multi-phase clock signals 3 divided by the divider 2. The two-phase clock signal multiplier circuit $5_1$ on the first stage conducts a two-multiplication of the two different phase clock signals D1 and D2 to generate two-multiplied two different phase clock signals D11 and D12. The two-phase clock signal multiplier circuit $5_2$ on the second stage receives the two-multiplied two different phase clock signals D11 and D12 from the two-phase clock signal multiplier circuit $5_1$ and conducts a further two-multiplication of the two-multiplied two different phase clock signals D11 and D12 to generate four-multiplied two different phase clock signals D21 and D22. The two-phase clock signal multiplier circuit $5_3$ on the third stage receives the four-multiplied two different phase clock signals D21 and D22 from the two-phase clock signal multiplier circuit $5_2$ and conducts a furthermore two-multiplication of the four-multiplied two different phase clock signals D21 and D22 to generate eight-multiplied two different phase clock signals D31 and D32. Each of the two-phase clock signal multiplier circuit conducts the same two-multiplication operation so that the two-phase clock signal multiplier circuit $5_n$ on the n-th stage receives the $2^{(n-1)}$-multiplied two different phase clock signals D(n-1)1 and D(n-1)2 from the two-phase clock signal multiplier circuit $5_{(n-1)}$ and conducts a furthermore two-multiplication of the $2^{(n-1)}$-multiplied two different phase clock signals D(n-1)1 and D(n-1)2 to generate $2^n$-multiplied two different phase clock signals Dn1 and Dn2. The clock signal synthesizer circuit 8 receives the $2^n$-multiplied two different phase clock signals Dn1 and Dn2 and synthesizes the $2^n$-multiplied two different phase clock signals Dn1 and Dn2 into the multiplied clock signal 9b.

Further, a period detection circuit 6 is provided for receiving the external clock signal 1 to generate a control signal 7 to be supplied to the individual two-phase clock signal multiplier circuits $5_1, 5_2$ - - - $5_n$, so as to compensate clock signal period dependency of each of the timing difference dividers included in the individual two-phase clock signal multiplier circuits $5_1, 5_2$ - - - $5_n$. The period detection circuit 6 of this embodiment has a predetermined number of stages on each of which a ring-oscillator and a counter are provided, so that the counter is operated to count the number of oscillations of the ring oscillator during one period of the external clock signal 1 for generating the control signal 7 on the basis of the counted number. As a result, the control signal 7 from the period detection circuit 6 settles a problem with variation in characteristics of the individual two-phase clock signal multiplier circuits $5_1, 5_2$ - - - $5_n$.

Figure 4:
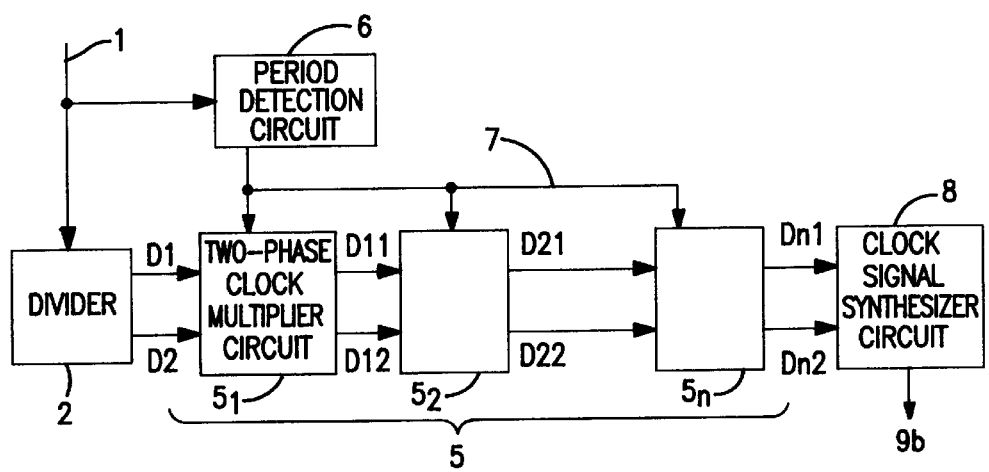
FIG. 4 is a novel clock signal control circuit of a first embodiment in accordance with the present invention.
Figure 5:
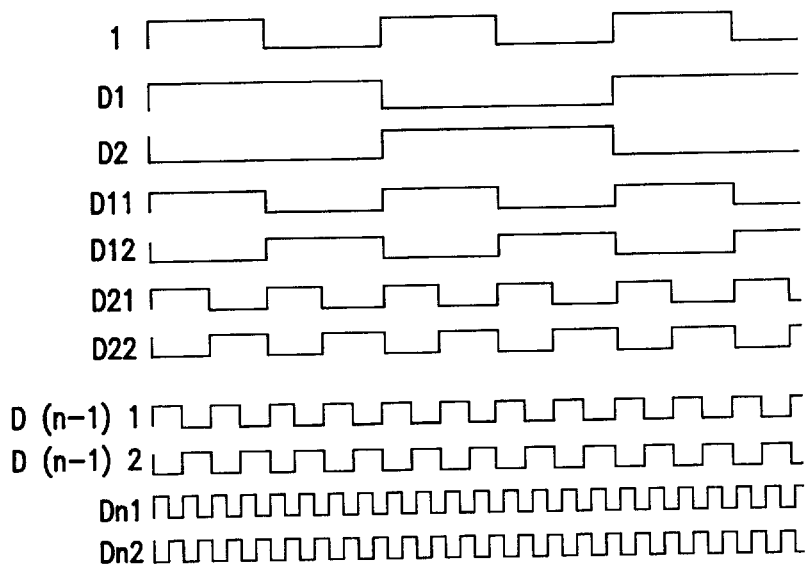
FIG. 5 is a timing chart illustrative of waveforms of the two-phase clock signals and a multiplied clock signal in relation to the novel clock signal control circuit of FIG. 4.

FIG. 5 is a timing chart illustrative of waveforms of the two-phase clock signals and a multiplied clock signal in relation to the novel clock signal control circuit of FIG. 4. The external clock signal 1 is divided by the divider 2 into the two different phase clock signals D1 and D2. The two different phase clock signals D1 and D2 are multiplied by the two-phase clock signal multiplier circuit 5i on the first stage to generate two-multiplied two different phase clock signals D11 and D12. The two-multiplied two different phase clock signals D11 and D12 are further multiplied by the two-phase clock signal multiplier circuit $5_2$ on the second stage to generate four-multiplied two different phase clock signals D21 and D22. The four-multiplied two different phase clock signals D21 and D22 are multiplied by the two-phase clock signal multiplier circuit $5_3$ on the third stage to generate eight-multiplied two different phase clock signals D31 and D32. The eight-multiplied two different phase clock signals D31 and D32 are multiplied by the two-phase clock signal multiplier circuit $5_4$ on the fourth or final stage to generate sixteen-multiplied two different phase clock signals D41 and D42. Each of the two-phase clock signal multiplier circuit conducts the same two-multiplication operation so that the two-phase clock signal multiplier circuit $5_n$ on the n-th stage receives the $2^{(n-1)}$-multiplied two different phase clock signals D(n-1)1 and D(n-1)2 from the two-phase clock signal multiplier circuit $5_{(n-1)}$ and conducts a furthermore two-multiplication of the $2^{(n-1)}$-multiplied two different phase clock signals D(n-1)1 and D(n-1)2 to generate $2^n$-multiplied two different phase clock signals Dn1 and Dn2. The $2^n$-multiplied two different phase clock signals Dn1 and Dn2 are synthesized by the clock signal synthesizer circuit 8 to generate the multiplied clock signal 9b.

Figure 6:
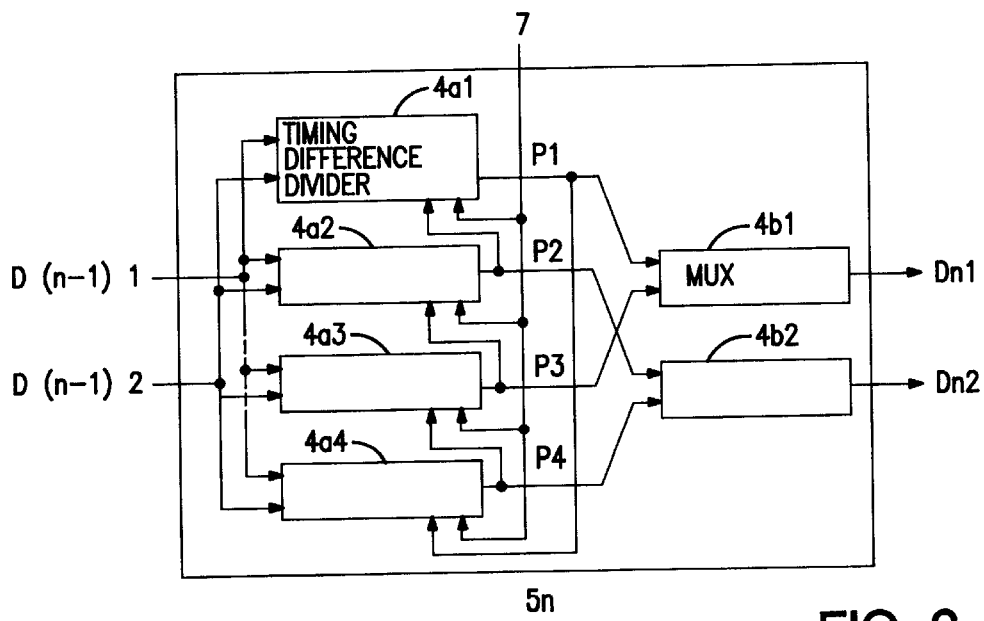
FIG. 6 is a schematic block diagram illustrative of each of the individual two-phase clock signal multiplier circuits in FIG. 4.

FIG. 6 is a schematic block diagram illustrative of each of the individual two-phase clock signal multiplier circuits in FIG. 4. The individual two-phase clock signal multiplier circuit of FIG. 6 is to be used in case of n=4, namely in case when four two-phase clock signal multiplier circuits are connected in series between the divider and the multiplexer. The two-phase clock signal multiplier circuit 5n has four timing difference dividers 4a1, 4a2, 4a3 and 4a4 connected in parallel to each other and two multiplexer circuits 4b1 and 4b2 connected in parallel to each other. The multiplexer circuit 4b1 is connected to the timing difference dividers 4a1 and 4a3, whilst the multiplexer circuit 4b2 is connected to the timing difference dividers 4a2 and 4a4. Each of the four timing difference dividers 4a1, 4a2, 4a3 and 4a4 receives $2^{(n-1)}$-multiplied two different phase clock signals D(n−1)1 and D(n−1)2.nd also receives the control signal 7. Further, the timing difference divider 4a1 receives an output clock signal P2 from the timing difference divider 4a2. The timing difference divider 4a2 receives an output clock signal P3 from the timing difference divider 4a3. The timing difference divider 4a3 receives an output clock signal P4 from the timing difference divider 4a4. The multiplexer circuit 4b1 receives the clock signals P1 and P3 from the timing difference dividers 4a1 and 4a3 to generate a multiplex clock signal Dn1. The multiplexer circuit 4b2 receives the clock signals P2 and P2 from the timing difference dividers 4a2 and 4a2 to generate a multiplex clock signal Dn2 which is different in phase from the multiplex clock signal Dn1.

Figure 7:
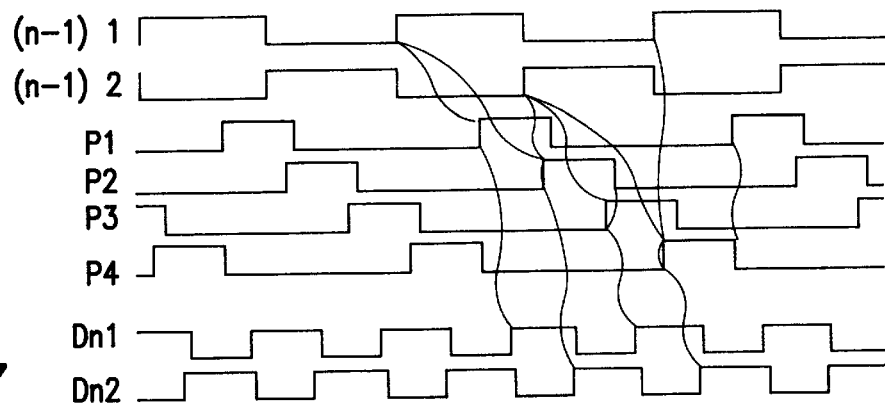
FIG. 7 is a timing chart illustrative of waveforms of the two-phase clock signals and a multiplied clock signal in relation to the clock signal multiplier circuit on the n-th stage in FIG. 6.

FIG. 7 is a timing chart illustrative of waveforms of the two-phase clock signals and a multiplied clock signal in relation to the clock signal multiplier circuit on the n-th stage in FIG. 6. Each of the four timing difference dividers 4a1, 4a2, 4a3 and 4a4 receives $2^{(n-1)}$-multiplied two different phase clock signals D(n−1)1 and D(n−1)2.nd also receives the control signal 7 to generate multiplied clock signals P1, P2, P3 and P4 respectively. The multiplexer circuit 4b1 receives the clock signals P1 and P3 from the timing difference dividers 4a1 and 4a3 to generate a multiplex clock signal Dn1. The multiplexer circuit 4b2 receives the clock signals P2 and P2 from the timing difference dividers 4a2 and 4a2 to generate a multiplex clock signal Dn2 which is different in phase from the multiplex clock signal Dn1. The rise-timing of the clock signal P1 depends upon an internal delay from the rise-edge of the clock signal D(n−1)1. The rise-timing of the clock signal P2 depends upon the internal delay from the rise-edge of the clock signal D(n−1)1 and also upon a timing division of the rise-timings of the clock signals D(n−1)1 and D(n−1)2. The rise-timing of the clock signal P3 depends upon an internal delay from the rise-edge of the clock signal D(n−1)2. The rise-timing of the clock signal P4 depends upon the internal delay from the rise-edge of the clock signal D(n−1)2.nd also upon a timing division of the rise-timings of the clock signals D(n−1)2.nd D(n−1)1.

The clock signal P2 is inputted into the timing difference divider 4a1 to control the fall-timing of the clock signal P1. The clock signal P3 is inputted into the timing difference divider 4a2 to control the fall-timing of the clock signal P2. The clock signal P4 is inputted into the timing difference divider 4a3 to control the fall-timing of the clock signal P3. The clock signal P1 is inputted into the timing difference divider 4a4 to control the fall-timing of the clock signal P4.

Consequently, the clock signals P1, P2, P3 and P4 are almost equal in period to the clock signals D(n−1)1 and D(n−1)2.nd are the four-phase clock signals having a duty ratio of 25%.

The clock signals P1 and P3 are inputted into the multiplexer circuit 4b1 to generate a multiplex clock signal Dn1. The clock signals P2 and P4 are inputted into the multiplexer circuit 4b2 to generate a multiplex clock signal Dn2. The clock signals Dn1 and Dn2 are the two-phase clock signals having a duty ratio of 50%.

Figure 8:
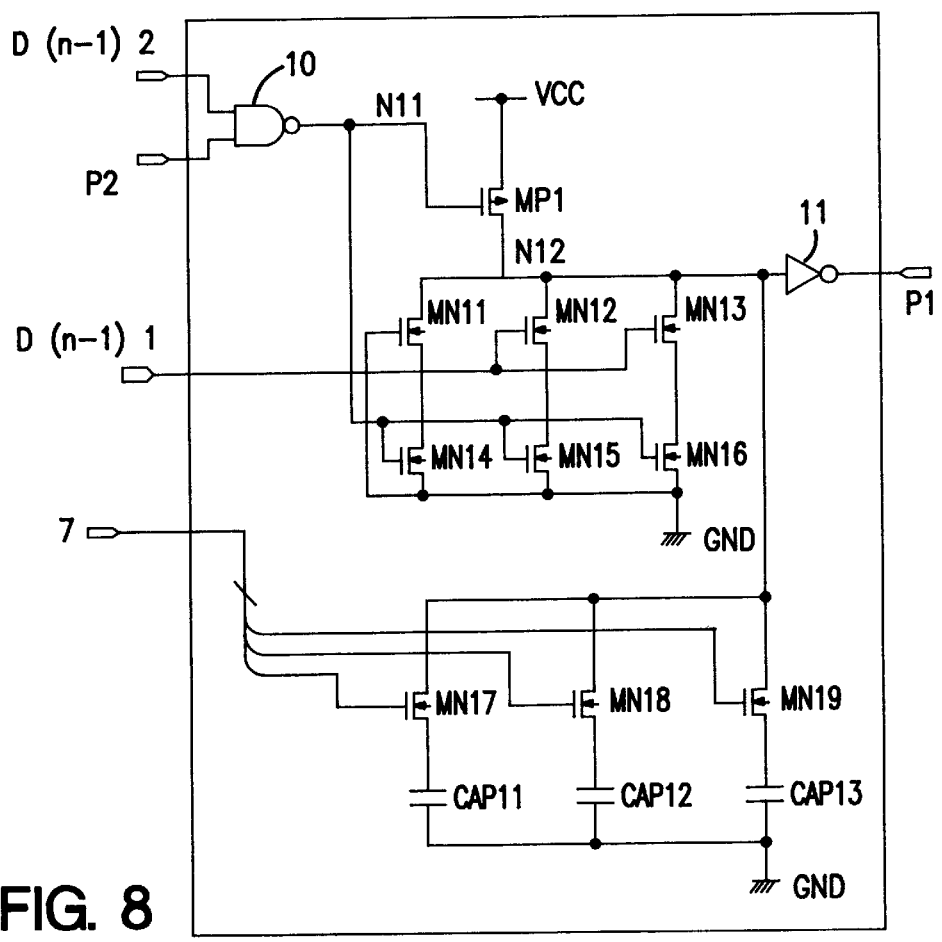
FIG. 8 is a Circuit diagram illustrative of the timing difference divider 4a1 in the two-phase clock signal multiplier circuit of FIG. 6.
Figure 9:
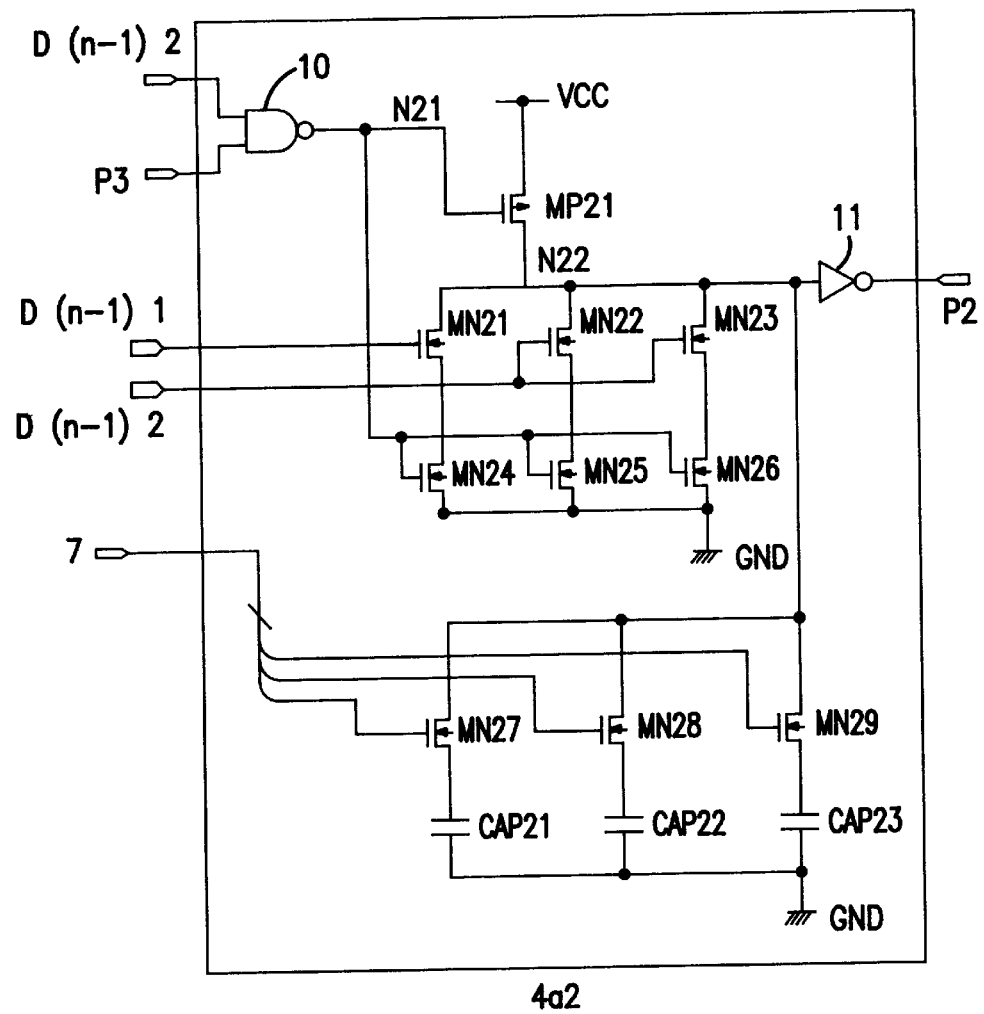
FIG. 9 is a circuit diagram illustrative of the timing difference divider 4a2 in the two-phase clock signal multiplier circuit of FIG. 6.
Figure 10:
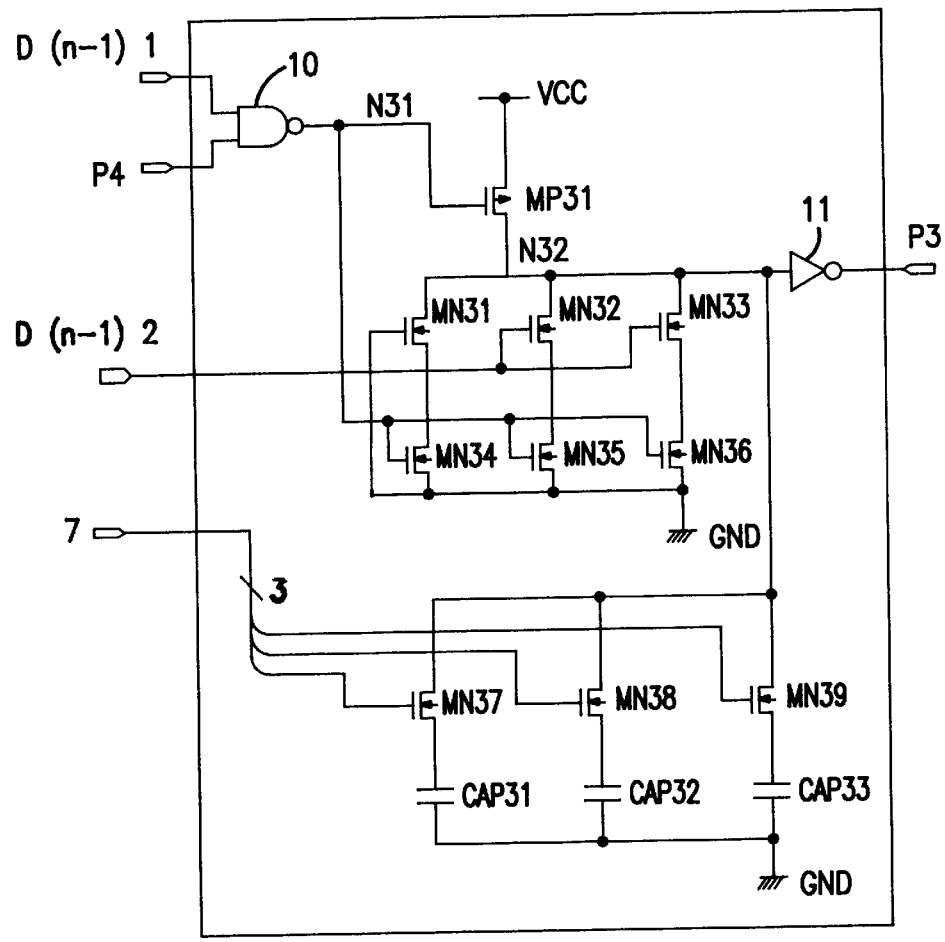
FIG. 10 is a circuit diagram illustrative of the timing difference divider 4a3 in the two-phase clock signal multiplier circuit of FIG. 6.
Figure 11:
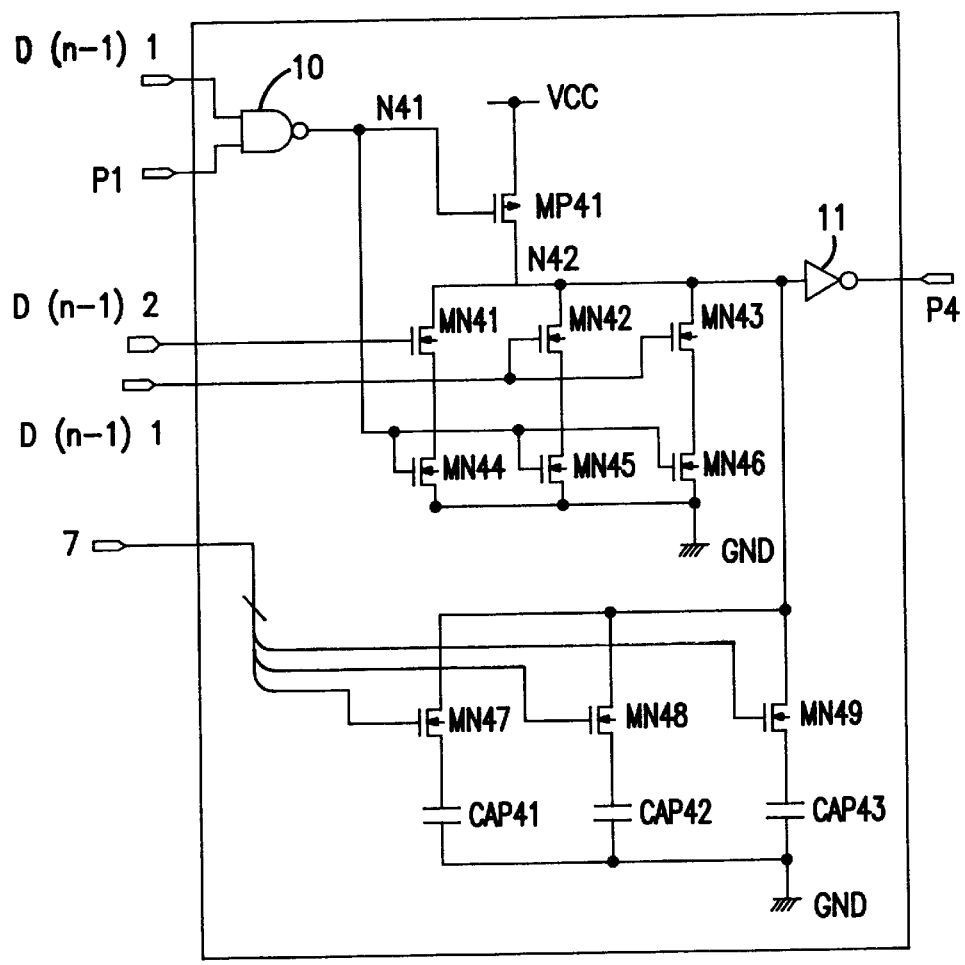
FIG. 11 is a circuit diagram illustrative of the timing difference divider 4a4 in the two-phase clock signal multiplier circuit of FIG. 6.

FIG. 8 is a circuit diagram illustrative of the timing difference divider 4a1 in the two-phase clock signal multiplier circuit of FIG. 6. FIG. 9 is a circuit diagram illustrative of the timing difference divider 4a2 in the two-phase clock signal multiplier circuit of FIG. 6. FIG. 10 is a circuit diagram illustrative of the timing difference divider 4a3 in the two-phase clock signal multiplier circuit of FIG. 6. FIG. 11 is a circuit diagram illustrative of the timing difference divider 4a4 in the two-phase clock signal multiplier circuit of FIG. 6. The four timing difference dividers 4a1, 4a2, 4a3 and 4a4 have the same elements, for example, a single two-input NAND gate 10, a single invertor 11, a single p-channel MOS field effect transistor, three sets of two n-channel MOS field effect transistors connected in series to each other, and three sets of an n-channel MOS field effect transistor and a capacitor, wherein the three n-channel MOS field effect transistors have the same gate width and the three sets of the n-channel MOS field effect transistor and the capacitor have size ratios of 1:2:4 in gate width and capacitance.

With reference to FIG. 8, the timing difference divider 4a1 has a p-channel MOS field effect transistor which has a source connected to a high voltage line VCC connected to a power supply and a drain connected to a node N12 as well as a gate connected to a node N11. The timing difference divider 4a1 has a first set of a series connection of n-channel MOS field effect transistors MN11 and MN14. The n-channel MOS field effect transistor MN11 has a drain connected to the node N12 and a source connected to the n-channel MOS field effect transistor MN14 as well as a gate connected to a ground line GND. The n-channel MOS field effect transistor MN14 has a drain connected to the ground line GND and a source connected to the n-channel MOS field effect transistor MN11 as well as a gate connected to the node N11. The timing difference divider 4a1 has a second set of a series connection of n-channel MOS field effect transistors MN12 and MN15. The n-channel MOS field effect transistor MN12 has a drain connected to the node N12 and a source connected to the n-channel MOS field effect transistor MN15 as well as a gate receiving the clock signal D(n−1)1. The n-channel MOS field effect transistor MN15 has a drain connected to the ground line GND and a source connected to the n-channel MOS field effect transistor MN12 as well as a gate connected to the node N12. The timing difference divider 4a1 has a third set of a series connection of n-channel MOS field effect transistors MN13 and MN16. The n-channel MOS field effect transistor MN13 has a drain connected to the node N12 and a source connected to the n-channel MOS field effect transistor MN16 as well as a gate receiving the clock signal D(n−1)1. The n-channel MOS field effect transistor MN16 has a drain connected to the ground line GND and a source connected to the n-channel MOS field effect transistor MN13 as well as a gate connected to the node N12. The timing difference divider 4a1 further has an NAND gate 10 with two inputs receiving the lock signals D(n−1)2.nd P2 and an output connected to the node N11. The timing difference divider 4a1 further has an invertor 11 with an input connected to the node N12 and an output from which an output clock signal P1 is outputted. The timing difference divider 4a1 further has a fourth set of a series connection of a n-channel MOS field effect transistor MN17 and a capacitor CAP11. The n-channel MOS field effect transistor MN17 has a drain connected to the node N12 and a source connected to the capacitor CAP11 as well as a gate receiving the control signal 7. The capacitor CAP11 is connected in series between the n-channel MOS field effect transistor MN17 and the ground line GND. The timing difference divider 4a1 further has a fifth set of a series connection of a n-channel MOS field effect transistor MN18 and a capacitor CAP12. The n-channel MOS field effect transistor MN18 has a drain connected to the node N12 and a source connected to the capacitor CAP12 as well as a gate receiving the control signal 7. The capacitor CAP12 is connected in series between the n-channel MOS field effect transistor MN18 and the ground line GND. The timing difference divider 4a1 further has a sixth set of a series connection of a n-channel MOS field effect transistor MN19 and a capacitor CAP13. The n-channel MOS field effect transistor MN19 has a drain connected to the node N13 and a source connected to the capacitor CAP13 as well as a gate receiving the control signal 7. The capacitor CAP13 is connected in series between the n-channel MOS field effect transistor MN19 and the ground line GND. The fourth set of the n-channel MOS field effect transistor MN17 and the capacitor CAP11, the fifth set of the n-channel MOS field effect transistor MN18 and the capacitor CAP12, and the sixth set of the n-channel MOS field effect transistor MN18 and the capacitor CAP13 have size ratios 1:2:4 in gate width and capacitance. Those series connections of the n-channel MOS field effect transistor MN17 and the capacitor CAP11, the n-channel MOS field effect transistor MN18 and the capacitor CAP12 and the n-channel MOS field effect transistor MN19 and the capacitor CAP13 serve as loads to the node N12. The n-channel MOS field effect transistors MN17, MN18 and MN19 show ON/OFF switching operations in accordance with the control signal applied to the gate electrodes thereof, so that the load to the node N12 is varied at eight levels.

With reference to FIG. 9, the timing difference divider 4a2 has a p-channel MOS field effect transistor which has a source connected to a high voltage line VCC connected to a power supply and a drain connected to a node N22 as well as a gate connected to a node N21. The timing difference divider 4a2 has a first set of a series connection of n-channel MOS field effect transistors MN21 and MN24. The n-channel MOS field effect transistor MN21 has a drain connected to the node N22 and a source connected to the n-channel MOS field effect transistor MN24 as well as a gate receiving the clock signal D(n-1)1. The n-channel MOS field effect transistor MN24 has a drain connected to the ground line GND and a source connected to the n-channel MOS field effect transistor MN21 as well as a gate connected to the node N21. The timing difference divider 4a has a second set of a series connection of n-channel MOS field effect transistors MN22 and MN25. The n-channel MOS field effect transistor MN22 has a drain connected to the node N22 and a source connected to the n-channel MOS field effect transistor MN25 as well as a gate receiving the clock signal D(n-1)2. The n-channel MOS field effect transistor MN25 has a drain connected to the ground line GND and a source connected to the n-channel MOS field effect transistor MN22 as well as a gate connected to the node N22. The timing difference divider 4a2 has a third set of a series connection of n-channel MOS field effect transistors MN23 and MN26. The n-channel MOS field effect transistor MN23 has a drain connected to the node N22 and a source connected to the n-channel MOS field effect transistor MN26 as well as a gate receiving the clock signal D(n-1)2. The n-channel MOS field effect transistor MN26 has a drain connected to the ground line GND and a source connected to the n-channel MOS field effect transistor MN23 as well as a gate connected to the node N22. The timing difference divider 4a2 further has an NAND gate 10 with two inputs receiving the lock signals D(n-1)2.nd P3 and an output connected to the node N21. The timing difference divider 4a2 further has an invertor 11 with an input connected to the node N22 and an output from which an output clock signal P2 is outputted. The timing difference divider 4a2 further has a fourth set of a series connection of a n-channel MOS field effect transistor MN27 and a capacitor CAP21. The n-channel MOS field effect transistor MN27 has a drain connected to the node N22 and a source connected to the capacitor CAP21 as well as a gate receiving the control signal 7. The capacitor CAP21 is connected in series between the n-channel MOS field effect transistor MN27 and the ground line GND. The timing difference divider 4a2 further has a fifth set of a series connection of a n-channel MOS field effect transistor MN28 and a capacitor CAP22. The n-channel MOS field effect transistor MN28 has a drain connected to the node N22 and a source connected to the capacitor CAP22 as well as a gate receiving the control signal 7. The capacitor CAP22 is connected in series between the n-channel MOS field effect transistor MN28 and the ground line GND. The timing difference divider 4a2 further has a sixth set of a series connection of a n-channel MOS field effect transistor MN29 and a capacitor CAP23. The n-channel MOS field effect transistor MN29 has a drain connected to the node N23 and a source connected to the capacitor CAP23 as well as a gate receiving the control signal 7. The capacitor CAP23 is connected in series between the n-channel MOS field effect transistor MN29 and the ground line GND. The fourth set of the n-channel MOS field effect transistor MN27 and the capacitor CAP21, the fifth set of the n-channel MOS field effect transistor MN28 and the capacitor CAP22, and the sixth set of the n-channel MOS field effect transistor MN28 and the capacitor CAP23 have size ratios 1:2:4 in gate width and capacitance. Those series connections of the n-channel MOS field effect transistor MN27 and the capacitor CAP21, the n-channel MOS field effect transistor MN28 and the capacitor CAP22 and the n-channel MOS field effect transistor MN29 and the capacitor CAP23 serve as loads to the node N22. The n-channel MOS field effect transistors MN27, MN28 and MN29 show ON/OFF switching operations in accordance with the control signal applied to the gate electrodes thereof, so that the load to the node N22 is varied at eight levels.

With reference to FIG. 10, the timing difference divider 4a3 has a p-channel MOS field effect transistor which has a source connected to a high voltage line VCC connected to a power supply and a drain connected to a node N32 as well as a gate connected to a node N31. The timing difference divider 4a3 has a first set of a series connection of n-channel MOS field effect transistors MN31 and MN34. The n-channel MOS field effect transistor MN31 has a drain connected to the node N32 and a source connected to the n-channel MOS field effect transistor MN34 as well as a gate connected to a ground line GND. The n-channel MOS field effect transistor MN34 has a drain connected to the ground line GND and a source connected to the n-channel MOS field effect transistor MN31 as well as a gate connected to the node N31 The timing difference divider 4a3 has a second set of a series connection of n-channel MOS field effect transistors MN32 and MN35. The n-channel MOS field effect transistor MN32 has a drain connected to the node N32 and a source connected to the n-channel MOS field effect transistor MN35 as well as a gate receiving the clock signal D(n−1)2. The n-channel MOS field effect transistor MN35 has a drain connected to the ground line GND and a source connected to the n-channel MOS field effect transistor MN32 as well as a gate connected to the node N32. The timing difference divider 4a3 has a third set of a series connection of n-channel MOS field effect transistors MN33 and MN36. The n-channel MOS field effect transistor MN13 has a drain connected to the node N32 and a source connected to the n-channel MOS field effect transistor MN36 as well as a gate receiving the clock signal D(n−1)2. The n-channel MOS field effect transistor MN36 has a drain connected to the ground line GND and a source connected to the n-channel MOS field effect transistor MN33 as well as a gate connected to the node N32. The timing difference divider 4a3 further has an NAND gate 10 with two inputs receiving the lock signals D(n−1)1 and P4 and an output connected to the node N31. The timing difference divider 4a3 further has an invertor 11 with an input connected to the node N32 and an output from which an output clock signal P3 is outputted. The timing difference divider 4a3 further has a fourth set of a series connection of a n-channel MOS field effect transistor MN37 and a capacitor CAP31. The n-channel MOS field effect transistor MN37 has a drain connected to the node N32 and a source connected to the capacitor CAP31 as well as a gate receiving the control signal 7. The capacitor CAP31 is connected in series between the n-channel MOS field effect transistor MN37 and the ground line GND. The timing difference divider 4a3 further has a fifth set of a series connection of a n-channel MOS field effect transistor MN38 and a capacitor CAP32. The n-channel MOS field effect transistor MN38 has a drain connected to the node N32 and a source connected to the capacitor CAP32 as well as a gate receiving the control signal 7. The capacitor CAP32 is connected in series between the n-channel MOS field effect transistor MN38 and the ground line GND. The timing difference divider 4a3 further has a sixth set of a series connection of an n-channel MOS field effect transistor MN39 and a capacitor CAP33. The n-channel MOS field effect transistor MN39 has a drain connected to the node N33 and a source connected to the capacitor CAP33 as well as a gate receiving the control signal 7. The capacitor CAP33 is connected in series between the n-channel MOS field effect transistor MN39 and the ground line GND. The fourth set of the n-channel MOS field effect transistor MN37 and the capacitor CAP31, the fifth set of the n-channel MOS field effect transistor MN38 and the capacitor CAP32, and the sixth set of the n-channel MOS field effect transistor MN38 and the capacitor CAP33 have size ratios 1:2:4 in gate width and capacitance. Those series connections of the n-channel MOS field effect transistor MN37 and the capacitor CAP31, the n-channel MOS field effect transistor MN38 and the capacitor CAP32 and the n-channel MOS field effect transistor MN39 and the capacitor CAP33 serve as loads to the node N32. The n-channel MOS field effect transistors MN37, MN38 and MN39 show ON/OFF switching operations in accordance with the control signal applied to the gate electrodes thereof, so that the load to the node N32 is varied at eight levels.

With reference to FIG. 11, the timing difference divider 4a4 has a p-channel MOS field effect transistor which has a source connected to a high voltage line VCC connected to a power supply and a drain connected to a node N42 as well as a gate connected to a node N41. The timing difference divider 4a4 has a first set of a series connection of n-channel MOS field effect transistors MN41 and MN44. The n-channel MOS field effect transistor MN41 has a drain connected to the node N42 and a source connected to the n-channel MOS field effect transistor MN44 as well as a gate receiving the clock signal D(n−1)2. The n-channel MOS field effect transistor MN44 has a drain connected to the ground line GND and a source connected to the n-channel MOS field effect transistor MN41 as well as a gate connected to the node N41. The timing difference divider 4a4 has a second set of a series connection of n-channel MOS field effect transistors MN42 and MN45. The n-channel MOS field effect transistor MN42 has a drain connected to the node N22 and a source connected to the n-channel MOS field effect transistor MN45 as well as a gate receiving the clock signal D(n−1)1. The n-channel MOS field effect transistor MN45 has a drain connected to the ground line GND and a source connected to the n-channel MOS field effect transistor MN42 as well as a gate connected to the node N42. The timing difference divider 4a4 has a third set of a series connection of n-channel MOS field effect transistors MN43 and MN46. The n-channel MOS field effect transistor MN23 has a drain connected to the node N42 and a source connected to the n-channel MOS field effect transistor MN46 as well as a gate receiving the clock signal D(n−1)1. The n-channel MOS field effect transistor MN46 has a drain connected to the ground line GND and a source connected to the n-channel MOS field effect transistor MN43 as well as a gate connected to the node N42. The timing difference divider 4a4 further has an NAND gate 10 with two inputs receiving the lock signals D(n−1)1 and P1 and an output connected to the node N41. The timing difference divider 4a4 further has an invertor 11 with an input connected to the node N42 and an output from which an output clock signal P4 is outputted. The timing difference divider 4a4 further has a fourth set of a series connection of a n-channel MOS field effect transistor MN47 and a capacitor CAP41. The n-channel MOS field effect transistor MN47 has a drain connected to the node N42 and a source connected to the capacitor CAP41 as well as a gate receiving the control signal 7. The capacitor CAP41 is connected in series between the n-channel MOS field effect transistor MN47 and the ground line GND. The timing difference divider 4a2 further has a fifth set of a series connection of a n-channel MOS field effect transistor MN48 and a capacitor CAP42. The n-channel MOS field effect transistor MN48 has a drain connected to the node N42 and a source connected to the capacitor CAP42 as well as a gate receiving the control signal 7. The capacitor CAP42 is connected in series between the n-channel MOS field effect transistor MN48 and the ground line GND. The timing difference divider 4a2 further has a sixth set of a series connection of a n-channel MOS field effect transistor MN49 and a capacitor CAP43. The n-channel MOS field effect transistor MN49 has a drain connected to the node N43 and a source connected to the capacitor CAP43 as well as a gate receiving the control signal 7. The capacitor CAP43 is connected in series between the n-channel MOS field effect transistor MN49 and the ground line GND. The fourth set of the n-channel MOS field effect transistor MN47 and the capacitor CAP41, the fifth set of the n-channel MOS field effect transistor MN48 and the capacitor CAP42, and the sixth set of the n-channel MOS field effect transistor MN48 and the capacitor CAP43 have size ratios 1:2:4 in gate width and capacitance. Those series connections of the n-channel MOS field effect transistor MN47 and the capacitor CAP41, the n-channel MOS field effect transistor MN48 and the capacitor CAP42 and the n-channel MOS field effect transistor MN49 and the capacitor CAP43 serve as loads to the node N42. The n-channel MOS field effect transistors MN47, MN48 and MN49 show ON/OFF switching operations in accordance with the control signal applied to the gate electrodes thereof, so that the load to the node N42 is varied at eight levels.

Figure 12:
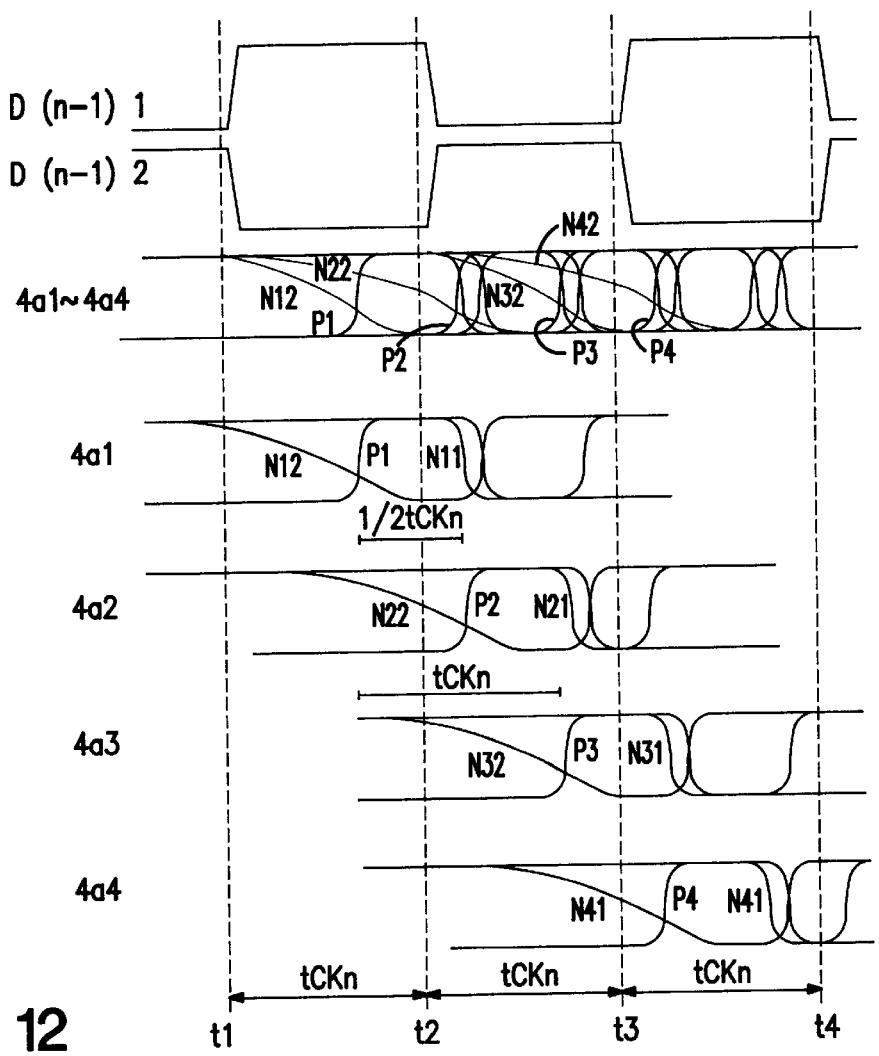
FIG. 12 is a timing chart illustrative of waveforms of signals at the two nodes of the timing difference dividers of FIGS. 8, 9, 10 and 11.

Operations of the timing difference dividers 4a1, 4a2, 4a3 and 4a4 will subsequently be described with reference to FIG. 12 which is a timing chart illustrative of waveforms of signals at the two nodes of the timing difference dividers of FIGS. 8, 9, 10 and 11.

The waveforms of the signals at the nodes N11 and N12 of the timing difference divider 4a1 of FIG. 8 have a period ranged from t1 to t3. The description will focus on rising of the clock signal P1. When a rising edge of the clock signal D(n−1)1 appears, the charge at the node N12 is drawn by the n-channel MOS field effect transistors MN12 and MN13, whereby a potential of the node N12 is dropped. When the potential of the node N12 reaches a threshold voltage of the invertor 11, the rising edge appears on the clock signal P1 from the invertor 11. Assuming that a charge CV is needed to be drawn from the node N12 at a charge drawing current I through the n-channel MOS field effect transistors MN12 and MN13 respectively for having the potential of the node N12 reach the threshold voltage of the invertor 11, CV/2I, as a result of drawing the charge CV at the currents 2I from the clock signal D(n−1)1, represents the time period during which the clock signal is risen from the rising edge up to the high level.

The fall-timing of the cock signal P1 will subsequently be described. When the output of the two-input NAND 10 becomes low, the p-channel MOS filed effect transistor MP11 turns ON whereby the node N12 is charged. The clock signals D(n−1)2.nd P2 are inputted into the two-input NAND gate 10. Only when both the clock signals D(n−1) 2.nd P2 are high level, then the output from the two-input NAND gate 10 is low. A period during which the clock P2 is high is within a period during which the clock signal D(n−1)2 is high, for which reason the output clock signal has an inverted waveform to the waveform of the clock signal P2. Since the initial value of the clock P2 has not been determined on power-ON, then the clock signal D(n−1)2 is inputted through the logic gate.

The waveforms of the signals at the nodes N21 and N22 of the timing difference divider 4a2 of FIG. 9 have a period ranged from t1 to t3. The description will focus on rising of the clock signal P2. In a period tCKn after a rising edge of the clock signal D(n−1)1 has appeared, the charge at the node N22 is drawn by the n-channel MOS field effect transistors MN12 and MN13. After the time period tCKN, the remaining charge is drawn from the node N22 through the n-channel MOS field effect transistors MN22 and MN23 after the rising edge has appeared on the clock signal D(n−1)2. When the potential of the node N22 reaches a threshold voltage of the invertor 11, the rising edge appears on the clock signal P2 from the invertor 11. Assuming that a charge CV is needed to be drawn from the node N22 at a charge drawing current I through the n-channel MOS field effect transistors MN21, MN22 and MN23 respectively for having the potential of the node N22 reach the threshold voltage of the invertor 11, tCKn+(CV−tCKnI)/2I=CV+tCKn/2, as a result of drawing the charge CV at the currents I during the period tCKn after the clock signal D(n−1)1 and subsequent drawing at the current 2I during the remaining period, represents the time period during which the clock signal is risen from the rising edge up to the high level. The difference in timing of the rising between the clock signals P2 and P1 corresponds to tCKn/2.

The fall-timing of the cock signal P2 will subsequently be described. When the output of the two-input NAND 10 becomes low, the p-channel MOS filed effect transistor MP21 turns ON whereby the node N22 is charged. The clock signals D(n−1)2.nd P3 are inputted into the two-input NAND gate 10. Only when both the clock signals D(n−1) 2.nd P3 are high level, then the output from the two-input NAND gate 10 is low.

The descriptions will be concerned with the clock signals P3 and P4. Since a difference in timing of the rising edge between the clock signals D(n−1)1 and D(n−1)2 is tCKn, a difference in timing of the rising edge between the clock signals P1 and P3 is tCKn. For this reason, a difference in timing of the rising edge between the clock signals P2 and P3 is tCKn/2. Also, a difference in timing of the rising edge between the clock signals P3 and P4 is tCKn/2. Also, a difference in timing of the rising edge between the clock signals P4 and P1 is tCKn/2. The clock signals P1, P2, P3 and P4 are four phase clock signals having a duty ratio of 25%. The clock signals P1 and P3 are subjected to multiplex by the multiplexer 4b1 whilst the clock signals P2 and P4 are subjected to multiplex by the multiplexer 4b2 thereby to generate two phase clock signals with a duty ratio of 50%.

In order to have the timing difference in rising edge of the clock signal P2 from the clock signal P1, it is required to satisfy a condition represented by CV−tCKnI>0, wherein even if the charge of the node N22 is drawn in a period tCKn through the n-channel MOS field effect transistor MN21, then the potential of the node N22 does not reach the threshold voltage of the invertor 11. However, the period tCKn of the external clock signal has not been determined on design of the circuit and the drawing current I is variable depending upon the device performances and characteristics. For those reasons, the value CV is varied in consideration of the period of the external clock signal and the device performances and characteristics.

The series connections of the n-channel MOS field effect transistors and the capacitors serve as loads to the common node. Since the n-channel MOS field effect transistors exhibit switching operations in accordance with the control signal. Further, three sets of the n-channel MOS field effect transistors and the capacitors have size ratios 1:2:4 in gate width and capacitance. For those reasons, the loads to the common node are controlled by the control signals at eight levels.

The control signal corresponds to the counted value obtained from the counter by counting the number of oscillation of the ring-oscillator during the period of the external clock signal. In accordance with the present circuit configuration, a relationship between the period of the external clock signal and the period of the ring-oscillator is coded, for which not only the reason operable range to the period of the external clock signal is increased but also the device performance and characteristic are not varied.

Figure 13:
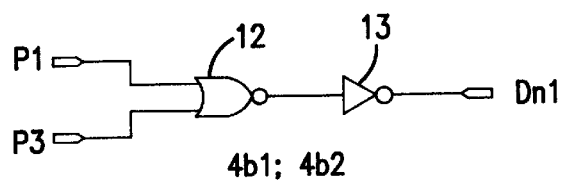
FIG. 13 is a circuit diagram illustrative of logic gates of the multiplexer used in the two-phase clock signal multiplier circuit.

The multiplexers 4b1 and 4b2 may comprise a series connection of a two-input NOR gate 12 and an invertor 13. FIG. 13 is a circuit diagram illustrative of logic gates of the multiplexer used in the two-phase clock signal multiplier circuit. For the multiplexer 4b1, the two-input NOR gate 12 receives the clock signals P1 and P3. An output from the two-input NOR gate 12 is inputted into the invertor 13. The invertor 13 outputs a multiplex clock signal Dn1. For the multiplexer 4b2, the two-input NOR gate 12 receives the clock signals P2 and P4. An output from the two-input NOR gate 12 is inputted into the invertor 13. The invertor 13 outputs a multiplex clock signal Dn2.

In accordance with the present invention, the two-phase clock signal multiplier circuits $5_1$, $5_2$ - - - $5_n$ are connected in series so that the frequencies of the input clock signals D1, D2, D21, D22, D31, D32, - - - D(n−1)1 and D(n−1)2 are different from each other by two times. The capacitance are adjusted between the two-phase clock signal multiplier circuits to optimize the CV value.

The external clock signal is divided into two phase clock signals to generate the multiplied clock signals without use of feedback circuits such as PLL or DLL.

Second Embodiment

Figure 14:
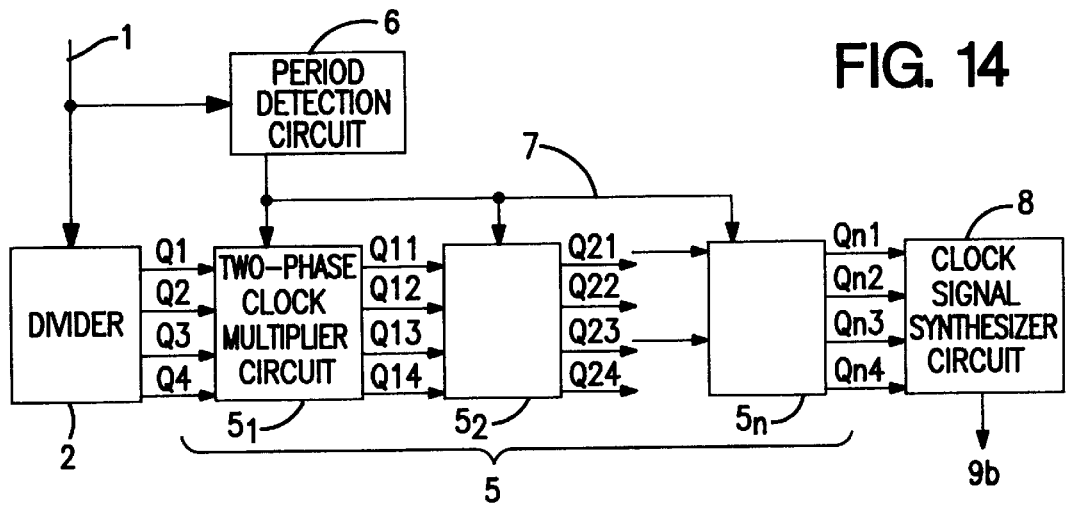
FIG. 14 is a novel clock signal control circuit of a first embodiment in accordance with the present invention.

A second embodiment according to the present invention will be described in detail with reference to the drawings. In accordance with the present invention provides a novel clock signal multiplier circuit for multiplying external clock signals as illustrated in FIG. 14, wherein an external clock signal is divided into four different phase clock signals for subsequent synthesizing the two different phase clock signals to obtain a multiplied clock signal. A ¼ divider 2 is operated to divide the external clock signal 1 into four different phase clock signals Q1, Q2, Q3 and Q4. Four-phase clock signal multiplier circuits $5_1$, $5_2$ - - - $5_n$ are connected in series to each other between the ¼ divider 2 and the clock signal synthesizer circuit 8 for dividing differences in input timing of the pulse edges with different phases of the multi-phase clock signals divided by the divider 2. The four-phase clock signal multiplier circuit $5_1$ on the first stage conducts a two-multiplication of the four different phase clock signals Q1, Q2, Q3 and Q4 to generate two-multiplied four different phase clock signals Q11, Q12, Q13 and Q14. The four-phase clock signal multiplier circuit $5_2$ on the second stage receives the two-multiplied four different phase clock signals Q11, Q12, Q13 and Q14 from the four-phase clock signal multiplier circuit $5_1$ and conducts a further two-multiplication of the two-multiplied four different phase clock signals Q11, Q12, Q13 and Q14 to generate four-multiplied four different phase clock signals Q21, Q22, Q23 and Q24. The four-phase clock signal multiplier circuit $5_3$ on the third stage receives the four-multiplied four different phase clock signals Q21, Q22, Q23 and Q24 from the four-phase clock signal multiplier circuit $5_2$ and conducts a furthermore two-multiplication of the four-multiplied four different phase clock signals Q21, Q22, Q23 and Q24 to generate eight-multiplied four different phase clock signals Q31, Q32, Q33 and Q34. Each of the four-phase clock signal multiplier circuit conducts the same two-multiplication operation so that the four-phase clock signal multiplier circuit $5_n$ on the n-th stage receives the $2^{(n-1)}$-multiplied four different phase clock signals Q(n−1)1, Q(n−1)2, Q(n−1)3 and Q(n−1)4 from the four-phase clock signal multiplier circuit $5_{(n-1)}$ and conducts a furthermore two-multiplication of the $2^{(n-1)}$-multiplied four different phase clock signals Q(n−1)1, Q(n−1)2, Q(n−1)3 and Q(n−1)4 to generate $2^n$-multiplied four different phase clock signals Qn1, Qn2, Qn3 and Qn4. The clock signal synthesizer circuit 8 receives the $2^n$-multiplied four different phase clock signals Qn1, Qn2, Qn3 and Qn4 and synthesizes the $2^n$-multiplied four different phase clock signals Qn1, Qn2, Qn3 and Qn4 into the multiplied clock signal 9b.

Further, a period detection circuit 6 is provided for receiving the external clock signal 1 to generate a control signal 7 to be supplied to the individual four-phase clock signal multiplier circuits $5_1$, $5_2$ - - - $5_n$, so as to compensate clock signal period dependency of each of the timing difference dividers included in the individual two-phase clock signal multiplier circuits $5_1$, $5_2$ - - - $5_n$. The period detection circuit 6 of this embodiment has a predetermined number of stages on each of which a ring-oscillator and a counter are provided, so that the counter is operated to count the number of oscillations of the ring oscillator during one period of the external clock signal 1 for generating the control signal 7 on the basis of the counted number. As a result, the control signal 7 from the period detection circuit 6 settles a problem with variation in characteristics of the individual two-phase clock signal multiplier circuits $5_1$, $5_2$ - - - $5_n$.

Figure 15:
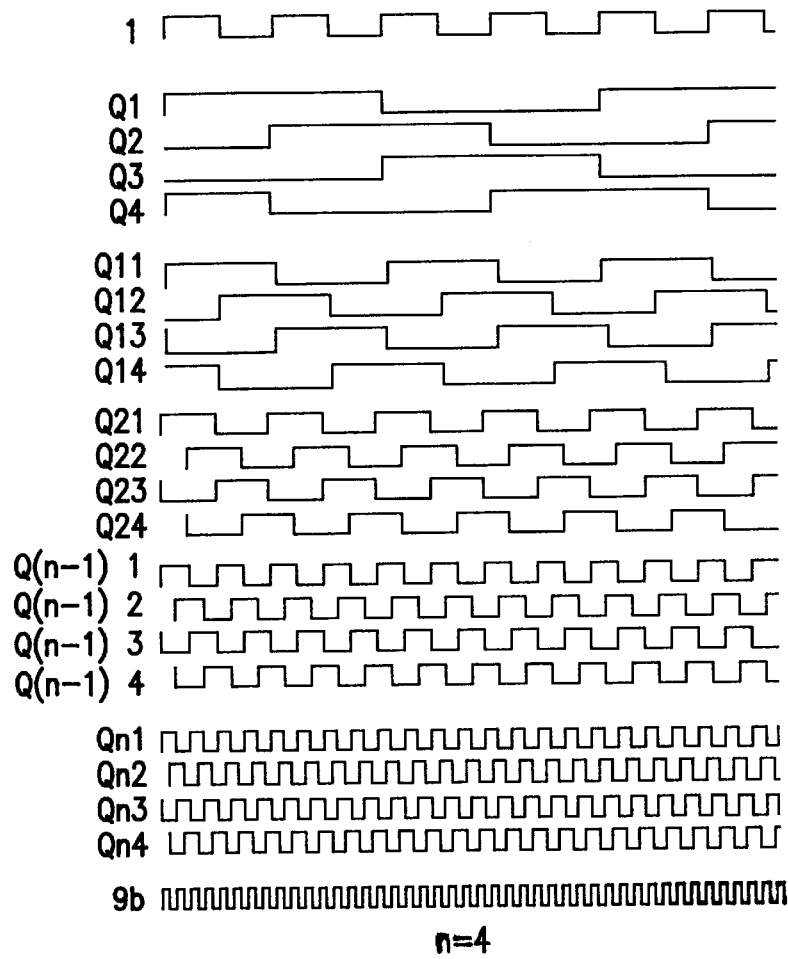
FIG. 15 is a timing chart illustrative of waveforms of the four-phase clock signals and a multiplied clock signal in relation to the novel clock signal control circuit of FIG. 14.

FIG. 15 is a timing chart illustrative of waveforms of the four-phase clock signals and a multiplied clock signal in relation to the novel clock signal control circuit of FIG. 14. The external clock signal 1 is divided by the divider 2 into the four different phase clock signals Q1, Q2, Q3 and Q4. The four different phase clock signals Q1, Q2, Q3 and Q4 are multiplied by the four-phase clock signal multiplier circuit $5_1$ on the first stage to generate two-multiplied four different phase clock signals Q11, Q12, Q13 and Q14. The two-multiplied four different phase clock signals Q11, Q12, Q13 and Q14 are further multiplied by the four-phase clock signal multiplier circuit $5_2$ on the second stage to generate four-multiplied four different phase clock signals Q21, Q22, Q23 and Q24. The four-multiplied four different phase clock signals Q21, Q22, Q23 and Q24 are multiplied by the four-phase clock signal multiplier circuit $5_3$ on the third stage to generate eight-multiplied four different phase clock signals Q31, Q32, Q33 and Q34. The eight-multiplied four different phase clock signals Q31, Q32, Q33 and Q34 are multiplied by the four-phase clock signal multiplier circuit $5_4$ on the fourth or final stage to generate sixteen-multiplied two different phase clock signals Q41, Q42, Q43 and Q44. Each of the four-phase clock signal multiplier circuit conducts the same two-multiplication operation so that the four-phase clock signal multiplier circuit $5_n$ on the n-th stage receives the $2^{(n-1)}$-multiplied four different phase clock signals Q(n−1)1, Q(n−1)2, Q(n−1)3 and Q(n−1)4 from the four-phase clock signal multiplier circuit $5_{(n-1)}$ and conducts a furthermore two-multiplication of the $2^{(n-1)}$-multiplied four different phase clock signals Q(n−1)1, Q(n−1)2, Q(n−1)3 and Q(n−1)4 to generate $2^n$-multiplied two different phase clock signals Qn1, Qn2, Qn3 and Qn4. The $2^n$-multiplied four different phase clock signals Qn1, Qn2, Qn3 and Qn4 are synthesized by the clock signal synthesizer circuit 8 to generate the multiplied clock signal 9b.

Figure 16:
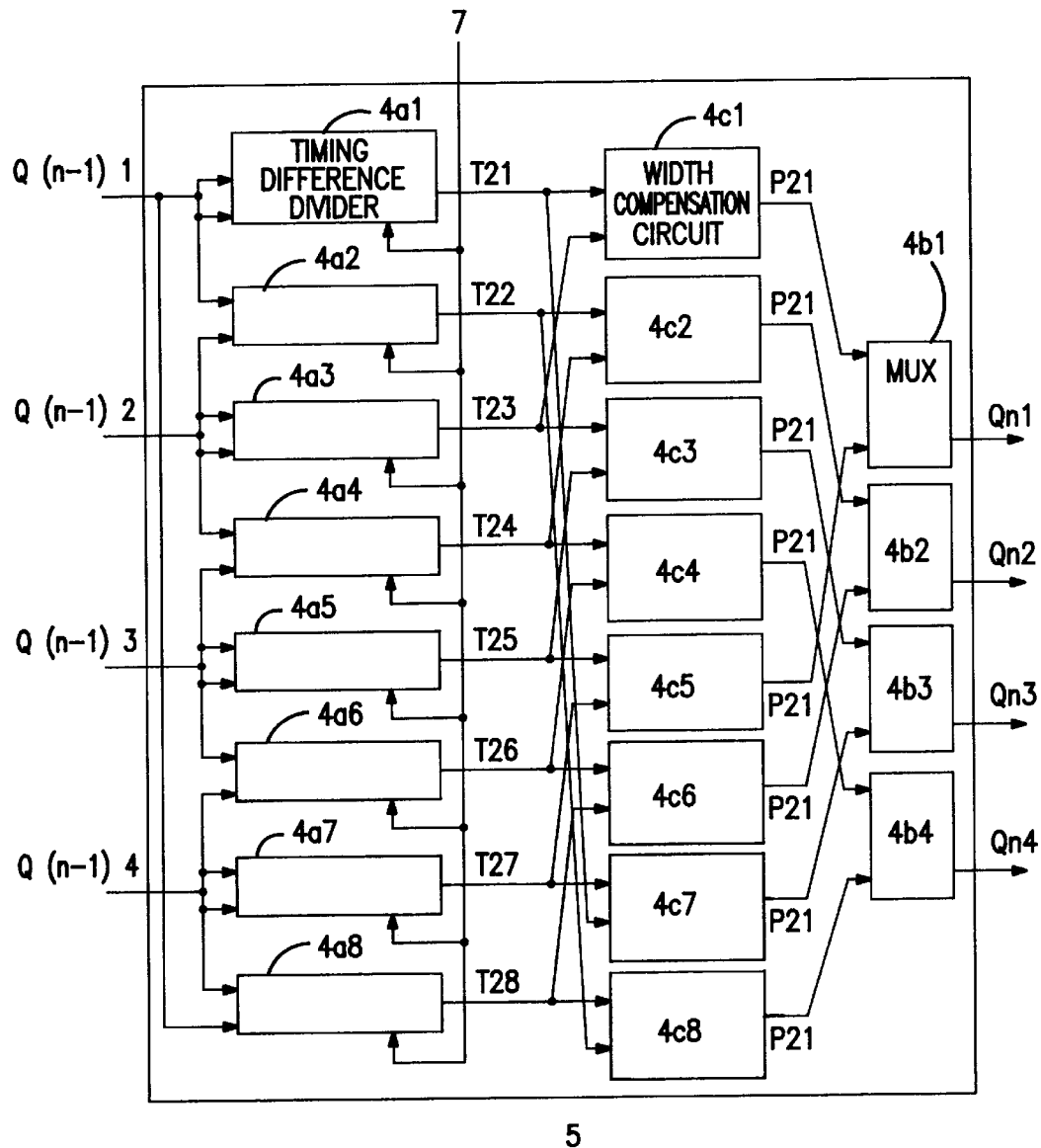
FIG. 16 is a schematic block diagram illustrative of each of the individual four-phase clock signal multiplier circuits in FIG. 14.

FIG. 16 is a schematic block diagram illustrative of each of the individual four-phase clock signal multiplier circuits in FIG. 14. The individual four-phase clock signal multiplier circuit of FIG. 16 is to be used in case of n=4, namely in case when four four-phase clock signal multiplier circuits are connected in series between the divider and the multiplexer. The four-phase clock signal multiplier circuit 5n has eight timing difference dividers 4a1, 4a2, 4a3, 4a4, 4a5, 4a6, 4a7 and 4a8 connected in parallel to each other, eight pulse width compensation circuits 4c1, 4c2, 4c3, 4c4, 4c5, 4c6, 4c7 and 4c8 connected in parallel to each other and four multiplexer circuits 4b1, 4b2, 4b3 and 4b4 connected in parallel to each other. The pulse width compensation circuit 4c1 is connected to the timing difference dividers 4a1 and 4a3. The pulse width compensation circuit 4c2 is connected to the timing difference dividers 4a2 and 4a4. The pulse width compensation circuit 4c3 is connected to the timing difference dividers 4a3 and 4a5. The pulse width compensation circuit 4c4 is connected to the timing difference dividers 4a4 and 4a6. The pulse width compensation circuit 4c5 is connected to the timing difference dividers 4a5 and 4a7. The pulse width compensation circuit 4c6 is connected to the timing difference dividers 4a6 and 4a8. The pulse width compensation circuit 4c7 is connected to the timing difference dividers 4a7 and 4a1. The pulse width compensation circuit 4c8 is connected to the timing difference dividers 4a8 and 4a2. The multiplexer circuit 4b1 is connected to the pulse width compensation circuits 4c1 and 4c5. The multiplexer circuit 4b2 is connected to the pulse width compensation circuits 4c2 and 4c6. The multiplexer circuit 4b3 is connected to the pulse width compensation circuits 4c3 and 4c7. The multiplexer circuit 4b4 is connected to the pulse width compensation circuits 4c4 and 4c8. Each of the eight timing difference dividers 4a1, 4a2, 4a3, 4a4, 4a5, 4a6, 4a7 and 4a8 receives the control signal 7. The timing difference divider 4a1 receives $2^{(n-1)}$-multiplied clock signal Q(n-1)1. The timing difference divider 4a2 receives $2^{(n-1)}$-multiplied two clock signals Q(n-1)1 and Q(n-1)2. The timing difference divider 4a3 receives $2^{(n-1)}$-multiplied clock signal Q(n-1)2. The timing difference divider 4a4 receives $2^{(n-1)}$-multiplied two clock signals Q(n-1)2 and Q(n-1)3. The timing difference divider 4a5 receives $2^{(n-1)}$-multiplied clock signal Q(n-1)3. The timing difference divider 4a6 receives $2^{(n-1)}$-multiplied two clock signals Q(n-1)3 and Q(n-1)4. The timing difference divider 4a7 receives $2^{(n-1)}$-multiplied clock signal Q(n-1)4. The timing difference divider 4a8 receives $2^{(n-1)}$-multiplied two clock signals Q(n-1)4 and Q(n-1)1. Further, the pulse width compensation circuit 4c1 receives clock signals T21 and T23 from the timing difference dividers 4a1 and 4c3. The pulse width compensation circuit 4c2 receives clock signals T22 and T24 from the timing difference dividers 4a2 and 4c4. The pulse width compensation circuit 4c3 receives clock signals T23 and T25 from the timing difference dividers 4a3 and 4c5. The pulse width compensation circuit 4c4 receives clock signals T24 and T26 from the timing difference dividers 4a4 and 4c6. The pulse width compensation circuit 4c5 receives clock signals T25 and T27 from the timing difference dividers 4a5 and 4c7. The pulse width compensation circuit 4c6 receives clock signals T26 and T28 from the timing difference dividers 4a6 and 4c8. The pulse width compensation circuit 4c7 receives clock signals T27 and T21 from the timing difference dividers 4a7 and 4c1. The pulse width compensation circuit 4c8 receives clock signals T28 and T22 from the timing difference dividers 4a8 and 4c2. The multiplexer circuit 4b1 receives the clock signals P21 and P25 from the timing difference dividers 4a1 and 4a5 to generate a multiplex clock signal Qn1. The multiplexer circuit 4b2 receives the clock signals P22 and P26 from the timing difference dividers 4a2 and 4a6 to generate a multiplex clock signal Qn2. The multiplexer circuit 4b3 receives the clock signals P23 and P27 from the timing difference dividers 4a3 and 4a7 to generate a multiplex clock signal Qn3. The multiplexer circuit 4b4 receives the clock signals P24 and P28 from the timing difference dividers 4a4 and 4a8 to generate a multiplex clock signal Qn4.

Figure 17:
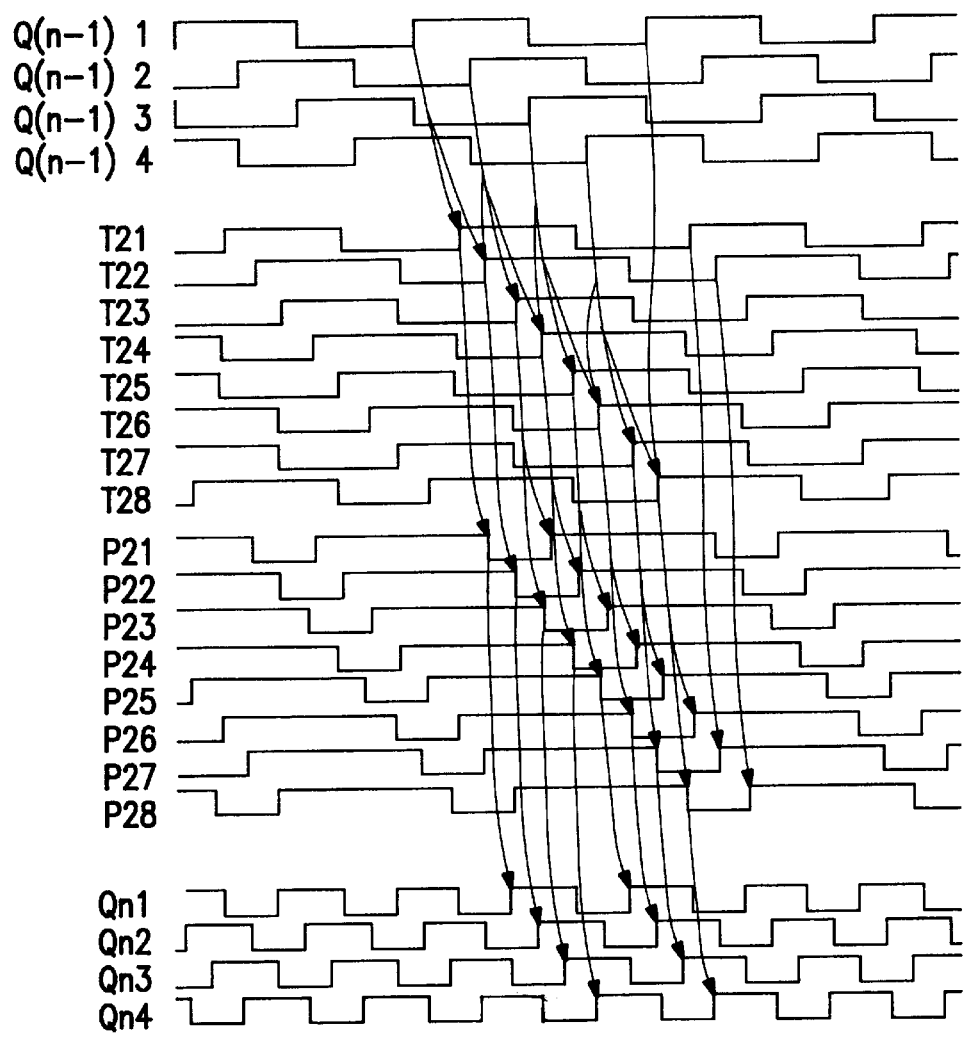
FIG. 17 is a timing chart illustrative of waveforms of the four-phase clock signals and a multiplied clock signal in relation to the clock signal multiplier circuit on the n-th stage in FIG. 16.

FIG. 17 is a timing chart illustrative of waveforms of the four-phase clock signals and a multiplied clock signal in relation to the clock signal multiplier circuit on the n-th stage in FIG. 16. The $2^{(n-1)}$-multiplied clock signal Q(n-1)1 is received by the timing difference divider 4a1 to generate the clock signal T21. The $2^{(n-1)}$-multiplied two clock signals Q(n-1)1 and Q(n-1)2 are received by the timing difference divider 4a2 to generate the clock signal T22. The $2^{(n-1)}$-multiplied clock signal Q(n-1)2 is also received by the timing difference divider 4a3 to generate the clock signal T23. The $2^{(n-1)}$-multiplied two clock signals Q(n-1)2 and Q(n-1)3 are received by the timing difference divider 4a4 to generate the clock signal T24. The $2^{(n-1)}$-multiplied clock signal Q(n-1)3 is received by the timing difference divider 4a5 to generate the clock signal T25. The $2^{(n-1)}$-multiplied two clock signals Q(n-1)3 and Q(n-1)4 are received by the timing difference divider 4a6 to generate the clock signal T26. The $2^{(n-1)}$-multiplied clock signal Q(n-1)4 is received by the timing difference divider 4a7 to generate the clock signal T27. The $2^{(n-1)}$-multiplied two clock signals Q(n-1)4 and Q(n-1)1 are received by the timing difference divider 4a8 to generate the clock signal T28.

Further, the clock signals T21 and T23 from the timing difference dividers 4a1 and 4c3 are received by the pulse width compensation circuit 4c1 The clock signals T22 and T24 from the timing difference dividers 4a2 and 4c4 are received by the pulse width compensation circuit 4c2. The clock signals T23 and T25 from the timing difference dividers 4a3 and 4c5 are received by the pulse width compensation circuit 4c3. The clock signals T24 and T26 from the timing difference dividers 4a4 and 4c6 are received by the pulse width compensation circuit 4c4. The clock signals T25 and T27 from the timing difference dividers 4a5 and 4c7 are received by the pulse width compensation circuit 4c5. The clock signals T26 and T28 from the timing difference dividers 4a6 and 4c8 are received by the pulse width compensation circuit 4c6. The clock signals T27 and T21 from the timing difference dividers 4a7 and 4c1 are received by the pulse width compensation circuit 4c7. The clock signals T28 and T22 from the timing difference dividers 4a8 and 4c2 are received by the pulse width compensation circuit 4c8. The clock signals P21 and P25 from the timing difference dividers 4a1 and 4a5 are received by the multiplexer circuit 4b1 to generate a multiplex clock signal Qn1. The clock signals P22 and P26 from the timing difference dividers 4a2 and 4a6 are received by the multiplexer circuit 4b2 to generate a multiplex clock signal Qn2. The clock signals P23 and P27 from the timing difference dividers 4a3 and 4a7 are received by the multiplexer circuit 4b3 to generate a multiplex clock signal Qn3. The clock signals P24 and P28 from the timing difference dividers 4a4 and 4a8 are received by the multiplexer circuit 4b4 to generate a multiplex clock signal Qn4.

The rise-timing of the clock signal P21 depends upon the internal delay from the rise-edge of the clock signal Q(n-1)1. The rise-timing of the clock signal P22 depends upon the internal delay from the rise-edge of the clock signal Q(n-1)1 and also upon a timing division of the rise-timings of the clock signals Q(n-1)1 and Q(n-1)2. The rise-timing of the clock signal P23 depends upon the internal delay from the rise-edge of the clock signal Q(n-1)2. The rise-timing of the clock signal P24 depends upon the internal delay from the rise-edge of the clock signal Q(n-1)2 and also upon a timing division of the rise-timings of the clock signals Q(n-1)2 and Q(n-1)3. The rise-timing of the clock signal P25 depends upon the internal delay from the rise-edge of the clock signal Q(n-1)3. The rise-timing of the clock signal P26 depends upon the internal delay from the rise-edge of the clock signal Q(n-1)3 and also upon a timing division of the rise-timings of the clock signals Q(n-1)3 and Q(n-1)4. The rise-timing of the clock signal P27 depends upon the internal delay from the rise-edge of the clock signal Q(n-1)4. The rise-timing of the clock signal P28 depends upon the internal delay from the rise-edge of the clock signal Q(n-1)4 and also upon a timing division of the rise-timings of the clock signals Q(n-1)4 and Q(n-1)1.

The clock signals T21 and T23 are inputted into the pulse width compensation circuit 4c1 to generate the pulse signal P21 with the rising-edge determined by the clock signal T21 and the falling-edge determined by the clock signal T23. The clock signals T22 and T24 are inputted into the pulse width compensation circuit 4c2 to generate the pulse signal P22 with the rising-edge determined by the clock signal T22 and the falling-edge determined by the clock signal T24. The clock signals T23 and T25 are inputted into the pulse width compensation circuit 4c3 to generate the pulse signal P23 with the rising-edge determined by the clock signal T23 and the falling-edge determined by the clock signal T25. The clock signals T24 and T26 are inputted into the pulse width compensation circuit 4c4 to generate the pulse signal P24 with the rising-edge determined by the clock signal T24 and the falling-edge determined by the clock signal T26. The clock signals T25 and T27 are inputted into the pulse width compensation circuit 4c5 to generate the pulse signal P25 with the rising-edge determined by the clock signal T25 and the falling-edge determined by the clock signal T27. The clock signals T26 and T28 are inputted into the pulse width compensation circuit 4c6 to generate the pulse signal P26 with the rising-edge determined by the clock signal T26 and the falling-edge determined by the clock signal T28. The clock signals T27 and T21 are inputted into the pulse width compensation circuit 4c7 to generate the pulse signal P27 with the rising-edge determined by the clock signal T27 and the falling-edge determined by the clock signal T21. The clock signals T28 and T22 are inputted into the pulse width compensation circuit 4c8 to generate the pulse signal P28 with the rising-edge determined by the clock signal T28 and the falling-edge determined by the clock signal T22. The lock signals are eight-phase pulse signals with a duty ratio of 25%.

Subsequently, the clock signals P21 and P25 differing in phase by 180 degrees from each other are multiplexed by the multiplexer 4b1 to generate a clock signal Qn1 with a duty ratio of 25%. The clock signals P22 and P26 differing in phase by 180 degrees from each other are multiplexed by the multiplexer 4b2 to generate a clock signal Qn2 with a duty ratio of 25%. The clock signals P23 and P27 differing in phase by 180 degrees from each other are multiplexed by the multiplexer 4b3 to generate a clock signal Qn3 with a duty ratio of 25%. The clock signals P24 and P28 differing in phase by 180 degrees from each other are multiplexed by the multiplexer 4b4 to generate a clock signal Qn4 with a duty ratio of 25%. The clock signals Qn1, Qn2, Qn3 and Qn4 are four-phase clock signals with a duty ratio of 50%. The period of the clock signals Qn1, Qn2, Qn3 and Qn4 corresponds to a half of the period of the clock signals Q(n−1)1, Q(n−1)2, Q(n−1)3 and Q(n−1)4. This means that the clock signals Q(n−1)1, Q(n−1)2, Q(n−1)3 and Q(n−1)4 are multiplied two times to generate the clock signals Qn1, Qn2, Qn3 and Qn4.

Figure 18:
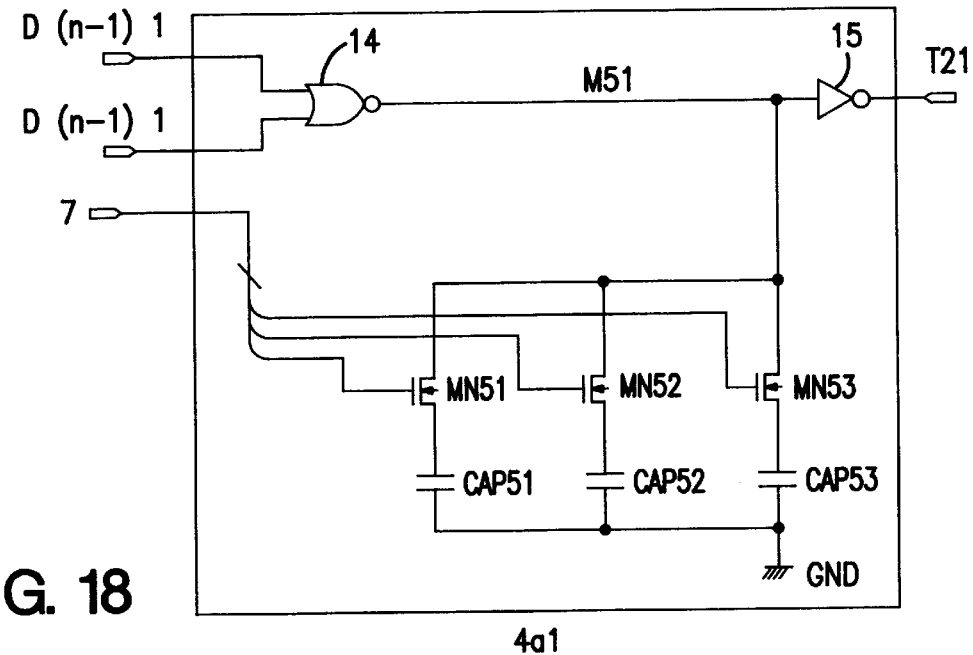
FIG. 18 is a circuit diagram illustrative of the timing difference divider 4a1 in the four-phase clock signal multiplier circuit of FIG. 16.
Figure 19:
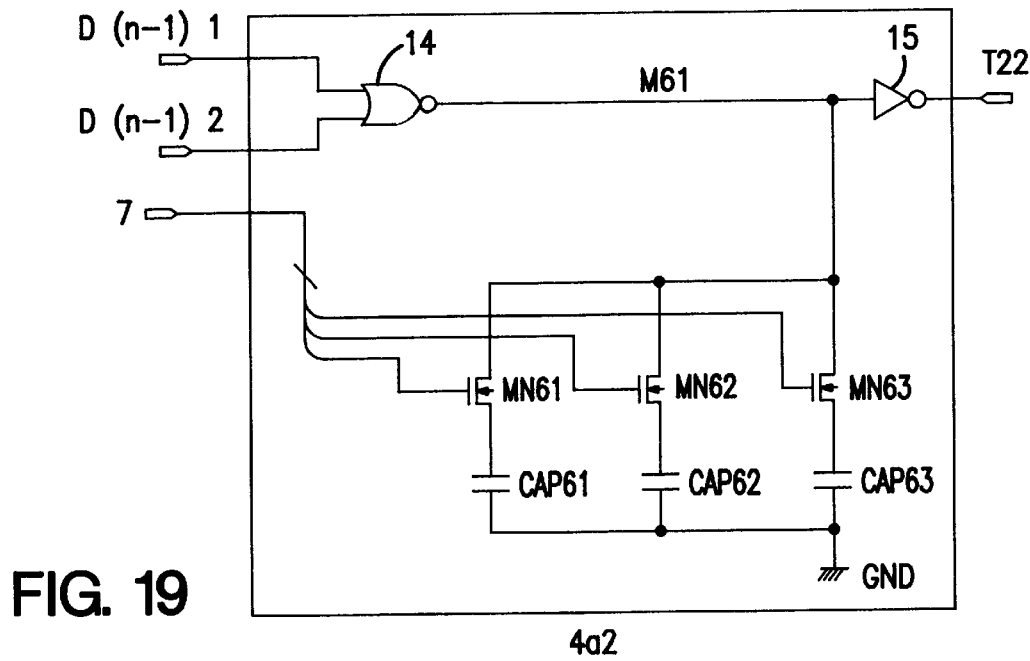
FIG. 19 is a circuit diagram illustrative of the timing difference divider 4a2 in the four-phase clock signal multiplier circuit of FIG. 16.

FIG. 18 is a circuit diagram illustrative of the timing difference divider 4a1 in the four-phase clock signal multiplier circuit of FIG. 16. FIG. 19 is a circuit diagram illustrative of the timing difference divider 4a2 in the four-phase clock signal multiplier circuit of FIG. 16. The eight timing difference dividers 4a1, 4a2. 4a3, 4a4, 4a5, 4a6. 4a7, 4a8 have the same circuit configuration as each other, for example, a single two-input NAND gate 14, a single invertor 15, and three sets of an n-channel MOS field effect transistor and a capacitor, wherein the three sets of the n-channel MOS field effect transistor and the capacitor have size ratios of 1:2:4 in gate width and capacitance.

With reference to FIG. 18, the timing difference divider 4a1 has a series connection of a two-input NOR gate 14 and an invertor 15. The two-input NOR gate 14 receives two of the same clock signals Q(n−1)1 and Q(n−1)1. An output of the NOR gate 14 is connected to a common node N51. The invertor 15 has an input connected to the common node N51 for receiving the output from the NOR gate 14. The invertor 15 outputs the clock signal T21. The timing difference divider 4a1 further has three sets of n-channel MOS field effect transistors MN51, MN52 and MN53 and capacitors CAP51, CAP52 and CAP53. The first series connection comprises an n-channel MOS field effect transistor MN51 and a capacitor CAP51. The n-channel MOS field effect transistor MN51 has a drain connected to the common node N51 and a source connected to the capacitor CAP51 as well as a gate receiving the control signal 7. The capacitor CAP51 is connected in series between the n-channel MOS field effect transistor MN51 and the ground line GND. The second series connection comprises an n-channel MOS field effect transistor MN52 and a capacitor CAP52. The n-channel MOS field effect transistor MN52 has a drain connected to the common node N51 and a source connected to the capacitor CAP52 as well as a gate receiving the control signal 7. The capacitor CAP52 is connected in series between the n-channel MOS field effect transistor MN52 and the ground line GND. The third series connection comprises an n-channel MOS field effect transistor MN53 and a capacitor CAP53. The n-channel MOS field effect transistor MN53 has a drain connected to the common node N51 and a source connected to the capacitor CAP53 as well as a gate receiving the control signal 7. The capacitor CAP53 is connected in series between the n-channel MOS field effect transistor MN53 and the ground line GND. The first set of the n-channel MOS field effect transistor MN51 and the capacitor CAP51, the second set of the n-channel MOS field effect transistor MN52 and the capacitor CAP52, and the third set of the n-channel MOS field effect transistor MN53 and the capacitor CAP53 have size ratios 1:2:4 in gate width and capacitance. Those series connections of the n-channel MOS field effect transistor MN51 and the capacitor CAP51, the n-channel MOS field effect transistor MN52 and the capacitor CAP52 and the n-channel MOS field effect transistor MN53 and the capacitor CAP53 serve as loads to the common node N51. The n-channel MOS field effect transistors MN51, MN52 and MN53 show ON/OFF switching operations in accordance with the control signal applied to the gate electrodes thereof, so that the load to the node N51 is varied at eight levels.

With reference to FIG. 19, the timing difference divider 4a2 has a series connection of a two-input NOR gate 14 and an invertor 15. The two-input NOR gate 14 receives two different clock signals Q(n−1)1 and Q(n−1)2. An output of the NOR gate 14 is connected to a common node N61. The invertor 15 has an input connected to the common node N61 for receiving the output from the NOR gate 14. The invertor 15 outputs the clock signal T22. The timing difference divider 4a2 further has three sets of n-channel MOS field effect transistors MN61, MN62 and MN63 and capacitors CAP61, CAP62 and CAP63. The first series connection comprises an n-channel MOS field effect transistor MN61 and a capacitor CAP61. The n-channel MOS field effect transistor MN61 has a drain connected to the common node N61 and a source connected to the capacitor CAP61 as well as a gate receiving the control signal 7. The capacitor CAP61 is connected in series between the n-channel MOS field effect transistor MN61 and the ground line GND. The second series connection comprises an n-channel MOS field effect transistor MN62 and a capacitor CAP62. The n-channel MOS field effect transistor MN62 has a drain connected to the common node N61 and a source connected to the capacitor CAP62 as well as a gate receiving the control signal 7. The capacitor CAP62 is connected in series between the n-channel MOS field effect transistor MN62 and the ground line GND. The third series connection comprises an n-channel MOS field effect transistor MN63 and a capacitor CAP63. The n-channel MOS field effect transistor MN63 has a drain connected to the common node N51 and a source connected to the capacitor CAP63 as well as a gate receiving the control signal 7. The capacitor CAP63 is connected in series between the n-channel MOS field effect transistor MN63 and the ground line GND. The first set of the n-channel MOS field effect transistor MN61 and the capacitor CAP61, the second set of the n-channel MOS field effect transistor MN62 and the capacitor CAP62, and the third set of the n-channel MOS field effect transistor MN63 and the capacitor CAP63 have size ratios 1:2:4 in gate width and capacitance. Those series connections of the n-channel MOS field effect transistor MN61 and the capacitor CAP61, the n-channel MOS field effect transistor MN62 and the capacitor CAP62 and the n-channel MOS field effect transistor MN63 and the capacitor CAP63 serve as loads to the common node N61. The n-channel MOS field effect transistors MN61, MN62 and MN63 show ON/OFF switching operations in accordance with the control signal applied to the gate electrodes thereof, so that the load to the node N61 is varied at eight levels.

Figure 20:
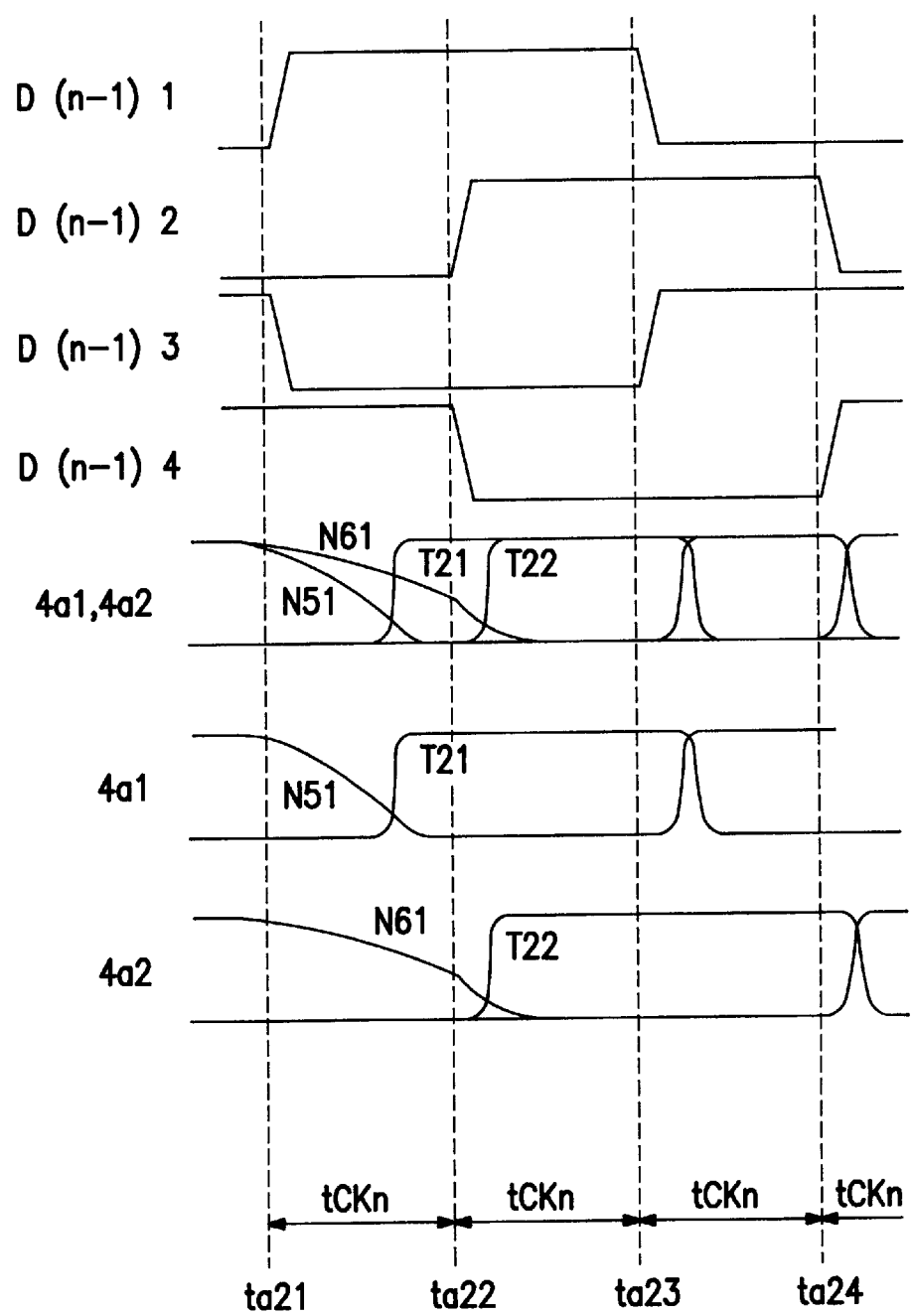
FIG. 20 is a timing chart illustrative of waveforms of signals at the two nodes of the timing difference dividers of FIGS. 18 and 19.

Operations of the timing difference dividers 4a1, 4a2, 4a3, 4a4, 4a5, 4a6, 4a7 and 4a8 will subsequently be described with reference to FIG. 20 which is a timing chart illustrative of waveforms of signals at the two nodes of the timing difference dividers of FIGS. 18 and 19.

The waveforms of the signals at the common node N51 of the timing difference divider 4a1 of FIG. 18 have a period ranged from ta21 to ta24. The description will focus on rising of the clock signal T21. When a rising edge of the clock signal D(n−1)1 appears, the charge at the node N51 is drawn to the NOR gate 14, whereby a potential of the node N51 is dropped. When the potential of the node N51 reaches a threshold voltage of the invertor 15, the rising edge appears on the clock signal T21 from the invertor 15. Assuming that a charge CV is needed to be drawn from the node N51 at a charge drawing current I through the n-channel MOS field effect transistors respectively for having the potential of the node N51 reach the threshold voltage of the invertor 15, CV/2I, as a result of drawing the charge CV at the currents 2I from the rising of the clock signal Q(n−1)1, represents the time period during which the clock signal is risen from the rising edge up to the high level. The rise-timing of the clock signal T21 is defined by the fact that the clock signal Q(n−1)1 becomes low level whereby the common node N51 is charged up to the high level.

The waveforms of the signals at the node N61 of the timing difference divider 4a2 of FIG. 19 have a period ranged from ta21 to ta24. The description will focus on rising of the clock signal T22. In a period tCKn after a rising edge of the clock signal Q(n−1)1 has appeared, the charge at the node N61 is drawn by the n-channel MOS field effect transistors. After the time period tCKn, the remaining charge is drawn from the node N61 through the n-channel MOS field effect transistors after the rising edge has appeared on the clock signal Q(n−1)2. When the potential of the node N61 reaches a threshold voltage of the invertor 15, the rising edge appears on the clock signal T22 from the invertor 15. Assuming that a charge CV is needed to be drawn from the node N61 at a charge drawing current I through the n-channel MOS field effect transistors respectively for having the potential of the node N61 reach the threshold voltage of the invertor 15, tCKn+(CV−tCKnI)/2I=CV+tCKn/2, as a result of drawing the charge CV at the currents I during the period tCKn after the clock signal Q(n−1)1 and subsequent drawing at the current 2I during the remaining period, represents the time period during which the clock signal is risen from the rising edge of the clock signal Q(n−1)1 up to the rising edge of the clock signal T22. The difference in timing of the rising between the clock signals T21 and T22 corresponds to tCKn/2. The rise-timing of the clock signal T22 is defined by the fact that both the clock signals Q(n−1)1 and Q(n−1)2 become low level whereby the common node N61 is charged up to the high level.

The other clock signals T23, T24, T25, T26, T27 and T28 can be described as described above. The difference in timing of the rising between the clock signals T23 and T24 corresponds to tCKn/2. The difference in timing of the rising between the clock signals T25 and T26 corresponds to tCKn/2. The difference in timing of the rising between the clock signals T27 and T28 corresponds to tCKn/2.

The clock signals T21, T22, T23, T24, T25, T26, T27 and T28 are eight phase clock signals having a duty ratio of 25%.

Figure 21:
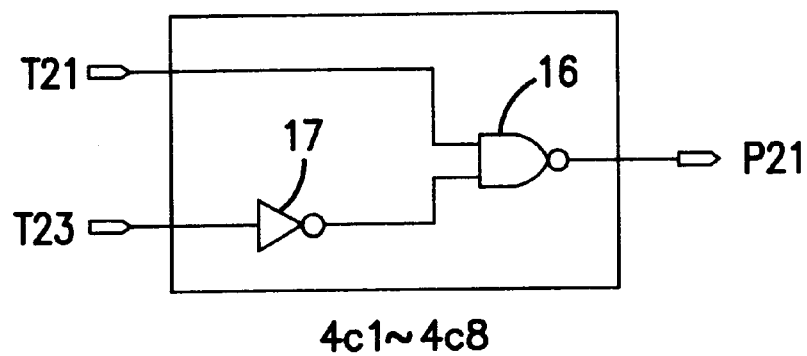
FIG. 21 is a circuit diagram illustrative of logic gates of the pulse width compensation circuit in the four-phase clock signal multiplier circuit of FIG. 16.

The pulse width compensation circuits 4c1, 4c2, 4c3, 4c4, 4c5, 4c6, 4c7 and 4c8 comprise an invertor 17 receiving the clock signal T23 and two-input NAND gate 16 receiving the output from the invertor 17 and the clock signal T21 to generate a clock signal P21. FIG. 21 is a circuit diagram illustrative of logic gates of the pulse width compensation circuit in the four-phase clock signal multiplier circuit of FIG. 16. The clock signals T21 and T23 are inputted into the pulse width compensation circuit 4c1 to generate the pulse signal P21 with the rising-edge determined by the clock signal T21 and the falling-edge determined by the clock signal T23. The clock signals T22 and T24 are inputted into the pulse width compensation circuit 4c2 to generate the pulse signal P22 with the rising-edge determined by the clock signal T22 and the falling-edge determined by the clock signal T24. The clock signals T23 and T25 are inputted into the pulse width compensation circuit 4c3 to generate the pulse signal P23 with the rising-edge determined by the clock signal T23 and the falling-edge determined by the clock signal T25. The clock signals T24 and T26 are inputted into the pulse width compensation circuit 4c4 to generate the pulse signal P24 with the rising-edge determined by the clock signal T24 and the falling-edge determined by the clock signal T26. The clock signals T25 and T27 are inputted into the pulse width compensation circuit 4c5 to generate the pulse signal P25 with the rising-edge determined by the clock signal T25 and the falling-edge determined by the clock signal T27. The clock signals T26 and T28 are inputted into the pulse width compensation circuit 4c6 to generate the pulse signal P26 with the rising-edge determined by the clock signal T26 and the falling-edge determined by the clock signal T28. The clock signals T27 and T21 are inputted into the pulse width compensation circuit 4c7 to generate the pulse signal P27 with the rising-edge determined by the clock signal T27 and the falling-edge determined by the clock signal T21. The clock signals T28 and T22 are inputted into the pulse width compensation circuit 4c8 to generate the pulse signal P28 with the rising-edge determined by the clock signal T28 and the falling-edge determined by the clock signal T22. The lock signals are eight-phase pulse signals with a duty ratio of 25%.

Figure 22:
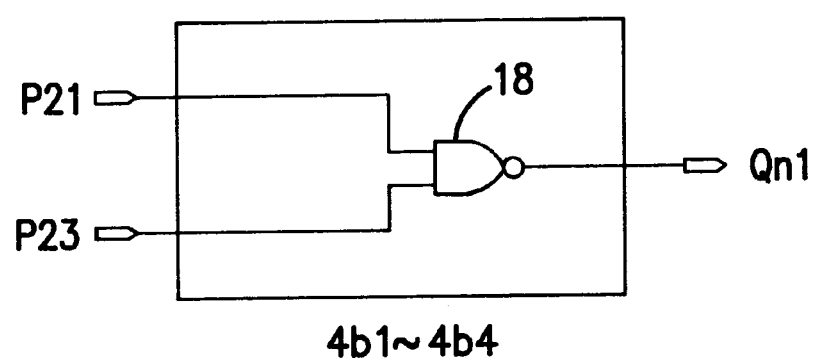
FIG. 22 is a circuit diagram illustrative of the multiplexer in the four-phase clock signal multiplier circuit of FIG. 16.

Subsequently, the clock signals P21, P22, P23, P24, P25, P26, P27 and P28 are subjected to multiplex by the multiplexers 4b1, 4b2, 4b3 and 4b4. FIG. 22 is a circuit diagram illustrative of the multiplexer in the four-phase clock signal multiplier circuit of FIG. 16. The clock signals P21 and P25 differing in phase by 180 degrees from each other are multiplexed by the multiplexer 4b1 to generate a clock signal Qn1 with a duty ratio of 25%. The clock signals P22 and P26 differing in phase by 180 degrees from each other are multiplexed by the multiplexer 4b2 to generate a clock signal Qn2 with a duty ratio of 25%. The clock signals P23 and P27 differing in phase by 180 degrees from each other are multiplexed by the multiplexer 4b3 to generate a clock signal Qn3 with a duty ratio of 25%. The clock signals P24 and P28 differing in phase by 180 degrees from each other are multiplexed by the multiplexer 4b4 to generate a clock signal Qn4 with a duty ratio of 25%. The clock signals Qn1, Qn2, Qn3 and Qn4 are four-phase clock signals with a duty ratio of 50%. The period of the clock signals Qn1, Qn2, Qn3 and Qn4 corresponds to a half of the period of the clock signals Q(n−1)1, Q(n−1)2, Q(n−1)3 and Q(n−1)4. This means that the clock signals Q(n−1)1, Q(n−1)2, Q(n−1)3 and Q(n−1)4 are multiplied two times to generate the clock signals Qn1, Qn2, Qn3 and Qn4 with a duty ratio of 50%. The period of the clock signals Qn1, Qn2, Qn3 and Qn4 corresponds to a half of the period of the clock signals Q(n−1)1, Q(n−1)2, Q(n−1)3 and Q(n−1)4.

In accordance with the present invention, the four-phase clock signal multiplier circuits $5_1, 5_2 - - - 5_n$ are connected in series so that the frequencies of the input clock signals Q1, Q2, Q3, Q4, Q21, Q22, Q23, Q24, - - - Q(n−1)1, Q(n−1)2, Q(n−1)3 and D(n−1)4 are different from each other by two times. The capacitance are adjusted between the four-phase clock signal multiplier circuits to optimize the CV value.

The external clock signal is divided into two phase clock signals to generate the multiplied clock signals without use of feedback circuits such as PLL or DLL. The use of the ¼ divider allows a simple circuit configuration such as logic gates.

In the foregoing embodiments, two-phase, four-phase or eight-phase clock signals are used. Sixteen-phase or thirty-two-phase clock signals are of course available.

In accordance with the present invention, the external clock signal is divided into multi-phase clock signals to take an intermediate timing between the different phase clock signals in order to generate multiplied clock signals without use of the looped circuit configuration. For this reason, it is possible to shorten the time necessary to obtain the multiplied clock signal. Further, it is possible to predict the necessary clock number, for which reason it is possible to shorten remarkably the waiting time for use of the multiplied clock signals.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A multiple phase clock signal multiplier comprising:
2n timing difference dividers connected in parallel to each other for dividing multiple phase clock signals having different phases from each other to generate different phase clock signals; and
n multiplexers connected in parallel to each other, each of said n multiplexers being connected to n of said timing difference dividers for multiplexing said different phase clock signals to generate multiplexed clock signals, where n is an even integer.

2. The multiplier of claim 1, further comprising
a divider connected to said timing difference dividers for dividing an external clock signal into the multiple phase clock signals; and
a synthesizer connected to said multiplexers for synthesizing said multiplexed clock signals into a single multiplied clock signal.

3. The multiplier of claim 2, wherein said divider comprises a ½ divider and four of said timing difference dividers and two of said multiplexers.

4. The multiplier of claim 1, wherein said divider comprises a ¼ divider and eight of said timing difference dividers and four of said multiplexers.

5. The clock signal control circuitry as claimed in claim 4, further comprising eight pulse width compensation circuits connected between said eight timing difference dividers and said four multiplexers.

6. The multiple phase clock signal multiplier as claimed in claim 1, where n=2, 4.

7. The multiple phase clock signal multiplier as claimed in claim 6, where n=4, and further comprising eight pulse width compensation circuits connected between said eight timing difference dividers and said four multiplexers.

8. The multiple phase clock signal multiplier as claimed in claim 1, wherein said timing difference dividers are connected to a period detection circuit for receiving a control signal from said period detection circuit.

9. The multiple phase clock signal multiplier as claimed in claim 1, wherein said timing difference dividers and said multiplexers form a plurality of multiple phase clock signal multiplier circuits connected in series.

10. The multiple phase clock signal multiplier as claimed in claim 1, wherein said timing difference dividers include MOS field effect transistors and capacitors and said timing difference dividers are different from each other in gate width of said MOS field effect transistors and in capacitance of said capacitors.

11. A multiple phase clock signal multiplier comprising:
a series connection of a plurality of multiple phase clock signal multiplier circuits, each of said multiple phase clock signal multiplier circuits comprising:
2n timing difference dividers connected in parallel to each other for dividing multiple phase clock signals having different phases from each other to generate different phase clock signals; and
n multiplexers connected in parallel to each other, each of said n multiplexers being connected to n of said timing difference dividers for multiplexing said different phase clock signals to generate multiplexed clock signals,
wherein n is an even integer.

12. The multiplier of claim 11, further comprising
a divider connected to said timing difference dividers for dividing an external clock signal into the multiple phase clock signals and
a synthesizer connected to said multiplexers for synthesizing said multiplexed clock signals into a single multiplied clock signal.

13. The multiplier of claim 12, wherein said divider comprises a ½ divider and four of said timing difference dividers and two of said multiplexers.

14. The multiplier of claim 12, wherein said divider comprises a ¼ divider and eight of said timing difference dividers and four of said multiplexers.

15. The multiple phase clock signal multiplier as claimed in claim 11, where n=2, 4.

16. The multiple phase clock signal multiplier as claimed in claim 15, where n=4, and wherein each of said multiple phase clock signal multiplier circuits has eight pulse width compensation circuits connected between said eight timing difference dividers and said four multiplexers.

17. The multiple phase clock signal multiplier as claimed in claim 11, wherein said timing difference dividers are connected to a period detection circuit for receiving a control signal from said period detection circuit.

18. The multiple phase clock signal multiplier as claimed in claim 11, wherein said timing difference dividers of each of said multiple phase clock signal multiplier circuits include MOS field effect transistors and capacitors and said timing difference dividers are different from each other in gate width of said MOS field effect transistors and in capacitance of said capacitors.

19. A multiple phase clock signal multiplier comprising:

2n first means connected in parallel to each other for dividing multiple phase clock signals having different phases from each other to generate different phase clock signals; and n second means connected in parallel to each other, each of said n second means being connected to n of said 2n first means for multiplexing said different phase clock signals to generate multiplexed clock signals, where n is an even integer.

20. The multiplier of claim 19, further comprising:

a third means connected to said 2n first means for dividing an external clock signal into the multiple phase clock signals and a fourth means connected to said n second means for synthesizing said multiplexed clock signals into a single multiplied clock signal.

21. The multiplier of claim 20, wherein said third means comprises a ½ divider and wherein said 2n first means comprise four timing difference dividers connected in parallel to each other and said n second means comprise two multiplexers connected in parallel to each other.

22. The multiplier of claim 20, wherein said third means comprises a ¼ divider and wherein said 2n first means comprise eight timing difference dividers connected in parallel to each other and said n second means comprise four multiplexers connected in parallel to each other.

23. The multiplier of claim 22, further comprising eight pulse width compensation circuits connected between said eight timing difference dividers and said four multiplexers.

24. The multiple phase clock signal multiplier as claimed in claim 19, where n=2, 4.

25. The multiple phase clock signal multiplier as claimed in claim 24, where n=4, and further comprising eight pulse width compensation circuits connected between said eight first means and said four second means.

26. The multiple phase clock signal multiplier as claimed in claim 19, wherein said 2n first means are connected to a period detection circuit for receiving a control signal from said period detection circuit.

27. The multiple phase clock signal multiplier as claimed in claim 19, wherein said 2n first means and said n second means form a plurality of multiple phase clock signal multiplier circuits connected in series.

28. The multiple phase clock signal multiplier as claimed in claim 19, wherein said 2n first means include MOS field effect transistors and capacitors and said 2n first means are different from each other in gate width of said MOS field effect transistors and in capacitance of said capacitors.

29. A multiple phase clock signal multiplier comprising:

a plurality of timing difference dividers for dividing multiple phase clock signals having different phases from each other to generate different phase clock signals; and a plurality of multiplexers connected to said timing difference dividers for multiplexing said different phase clock signals to generate multiplexed clock signals, wherein said timing difference dividers are connected to a period detection circuit for receiving a control signal from said period detection circuit.

30. A multiple phase clock signal multiplier comprising:

a series connection of a plurality of multiple phase clock signal multiplier circuits, each of said multiple phase clock signal multiplier circuits comprising:

a plurality of timing difference dividers for dividing multiple phase clock signals having different phases from each other to generate different phase clock signals; and a plurality of multiplexers connected to said timing difference dividers for multiplexing said different phase clock signals to generate multiplexed clock signals, wherein said timing difference dividers are connected to a period detection circuit for receiving a control signal from said period detection circuit.

31. A multiple phase clock signal multiplier comprising:

a plural first means for dividing multiple phase clock signals having different phases from each other to generate different phase clock signals; and a plural second means connected to said first means for multiplexing said different phase clock signals to generate multiplexed clock signals, wherein said plural first means are connected to a period detection circuit for receiving a control signal from said period detection circuit.

* * * * *